United States Patent
Han

(10) Patent No.: US 11,417,707 B2
(45) Date of Patent: Aug. 16, 2022

(54) NONVOLATILE MEMORY DEVICE OF THREE-DIMENSIONAL STRUCTURE INCLUDING RESISTANCE CHANGE ELEMENT

(71) Applicant: SK hynix Inc., Icheon-si (KR)

(72) Inventor: Jae Hyun Han, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 107 days.

(21) Appl. No.: 16/983,929

(22) Filed: Aug. 3, 2020

(65) Prior Publication Data

US 2021/0296402 A1   Sep. 23, 2021

(30) Foreign Application Priority Data

Mar. 19, 2020 (KR) .................. 10-2020-0033925

(51) Int. Cl.
*H01L 27/24* (2006.01)
*H01L 45/00* (2006.01)

(52) U.S. Cl.
CPC ...... *H01L 27/2481* (2013.01); *H01L 45/1233* (2013.01); *H01L 45/1253* (2013.01); *H01L 45/147* (2013.01)

(58) Field of Classification Search
CPC .................. H01L 27/2481; H01L 45/085
See application file for complete search history.

(56) References Cited

U.S. PATENT DOCUMENTS 7,977,722 B2    7/2011  Wang et al.
9,076,723 B1 *  7/2015  Matsunami ......... H01L 45/1266
2009/0303773 A1  12/2009  Rinerson et al.

* cited by examiner

*Primary Examiner* — Shih Tsun A Chou

(57) ABSTRACT

A nonvolatile memory device according to an embodiment includes a substrate and a gate structure disposed on the substrate. The gate structure includes at least one gate electrode layer and at least one interlayer insulation layer that are alternately stacked. In addition, the nonvolatile memory device includes a hole pattern penetrating the gate structure on the substrate, and a gate insulation layer, a first ion retention layer, a second ion retention layer, and a channel layer sequentially covering a sidewall surface of the gate electrode layer in the hole pattern. The first and second ion retention layers comprise ions exchangeable with each other.

20 Claims, 21 Drawing Sheets

NONVOLATILE MEMORY DEVICE OF THREE-DIMENSIONAL STRUCTURE INCLUDING RESISTANCE CHANGE ELEMENT

CROSS-REFERENCE TO RELATED APPLICATIONS

The present application claims priority under 35 U.S.C. § 119(a) to Korean Application No. 10-2020-0033925, filed on Mar. 19, 2020, which is incorporated herein by reference in its entirety.

BACKGROUND

1. Technical Field

The present disclosure generally relates to a nonvolatile memory device and, more particularly, to a nonvolatile memory device with a three-dimensional structure that includes a resistance change element.

2. Related Art

According to the trends of decreasing design rules and increasing degree of integration, a memory device structure with a three-dimensional structure has emerged. Currently, a nonvolatile memory device such as a flash memory has been produced as a three-dimensional structure employing a three-layer stacked structure of a charge tunneling layer, a charge trap layer, and a charge barrier layer as a charge storage structure.

Recently, various nonvolatile memory devices having structures different from traditional flash memory devices have been proposed. An example of a nonvolatile memory device is a resistance change memory device. While the flash memory device implements a memory function through charge storage, the resistance change memory device variably changes the resistance state of a memory layer in a memory cell between a high resistance state and a low resistance state, and stores the changed resistance states in a nonvolatile manner. In this way, the resistance change memory device can write the resistance state to the memory cell as predetermined signal information.

SUMMARY

A nonvolatile memory device according to an embodiment of the present disclosure may include a substrate and a gate structure disposed on the substrate. The gate structure includes at least one gate electrode layer and at least one interlayer insulation layer that are alternately stacked. In addition, the nonvolatile memory device includes a hole pattern penetrating the gate structure on the substrate, and a gate insulation layer, a first ion retention layer, a second ion retention layer, and a channel layer sequentially cover a sidewall surface of the gate electrode layer. The first and second ion retention layers comprise ions exchangeable with each other.

A nonvolatile memory device according to another embodiment of the present disclosure may include a substrate, and a gate structure disposed on the substrate. The gate structure may include at least one gate electrode layer and at least one interlayer insulation layer that are alternately stacked along a first direction perpendicular to an upper surface of the substrate, and the gate structure extends in a second direction perpendicular to the first direction. In addition, the nonvolatile memory device may include a gate insulation layer, a first ion retention layer, a second ion retention layer, and a channel layer sequentially cover a sidewall surface of the gate electrode layer on the substrate. The first and second ion retention layers comprise ions exchangeable with each other.

DETAILED DESCRIPTION

Figure 1:
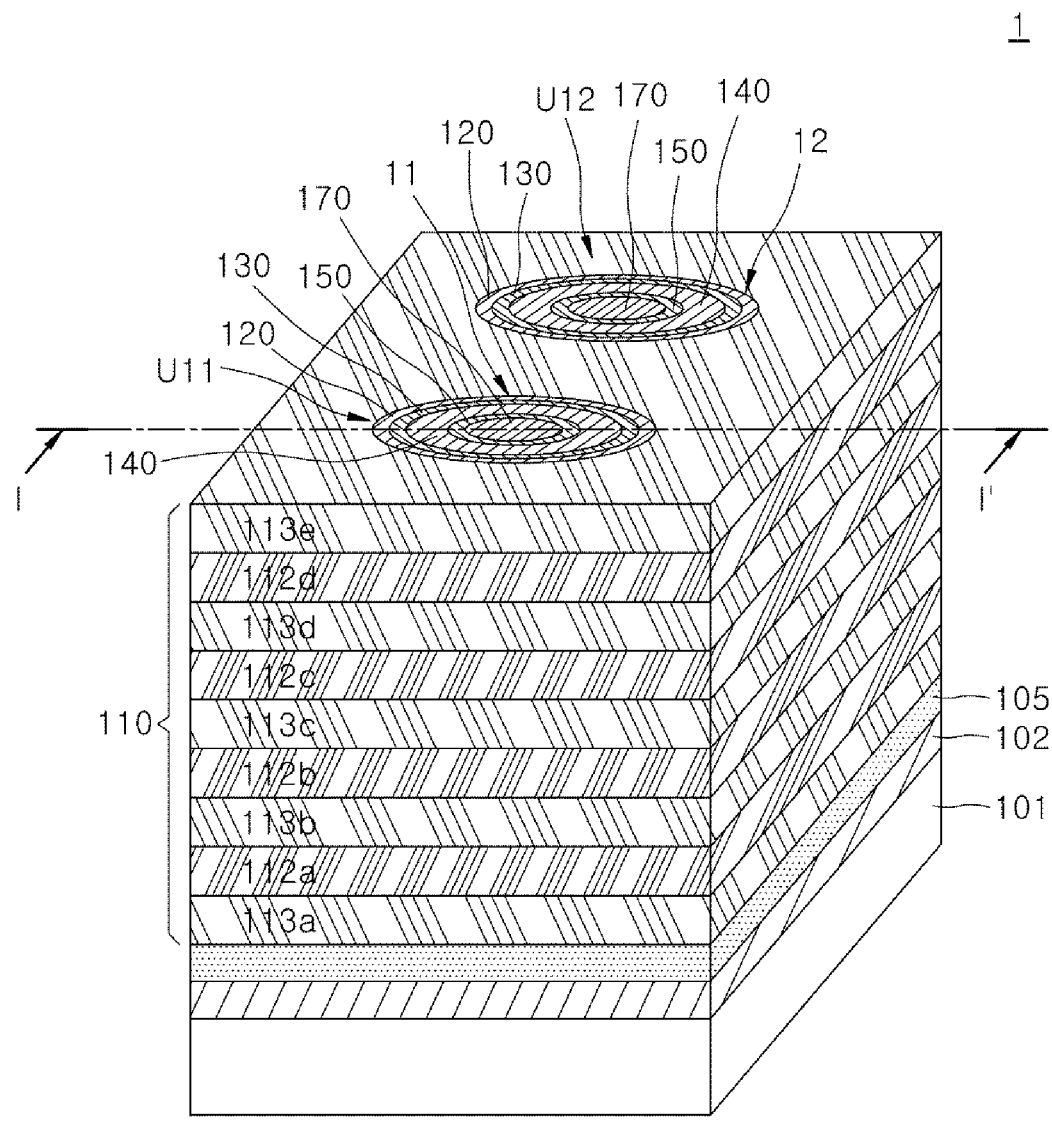
FIG. 1 is a perspective view schematically illustrating a nonvolatile memory device according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

Further, in performing a method or a manufacturing method, each process constituting the method can take place differently from the stipulated order unless a specific sequence is described explicitly in the context. In other words, each process may be performed in the same manner as stated order, and may be performed substantially at the same time. Also, at least a part of each of the above processes may be performed in a reversed order.

In this specification, the term "a predetermined direction" may mean a direction encompassing one direction determined in a coordinate system and a direction opposite to that direction. As an example, in the x-y-z coordinate system, the x-direction may encompass a direction parallel to the x-direction. That is, the x-direction may mean all of a direction in which an absolute value of the z-axis increases in a positive direction along the x-axis from the origin 0 and a direction in which an absolute value of the x-axis increases in a negative direction along the x-axis from the origin 0. The y-direction and the z-direction may each be interpreted in substantially the same way in the x-y-z coordinate system.

Figure 2:
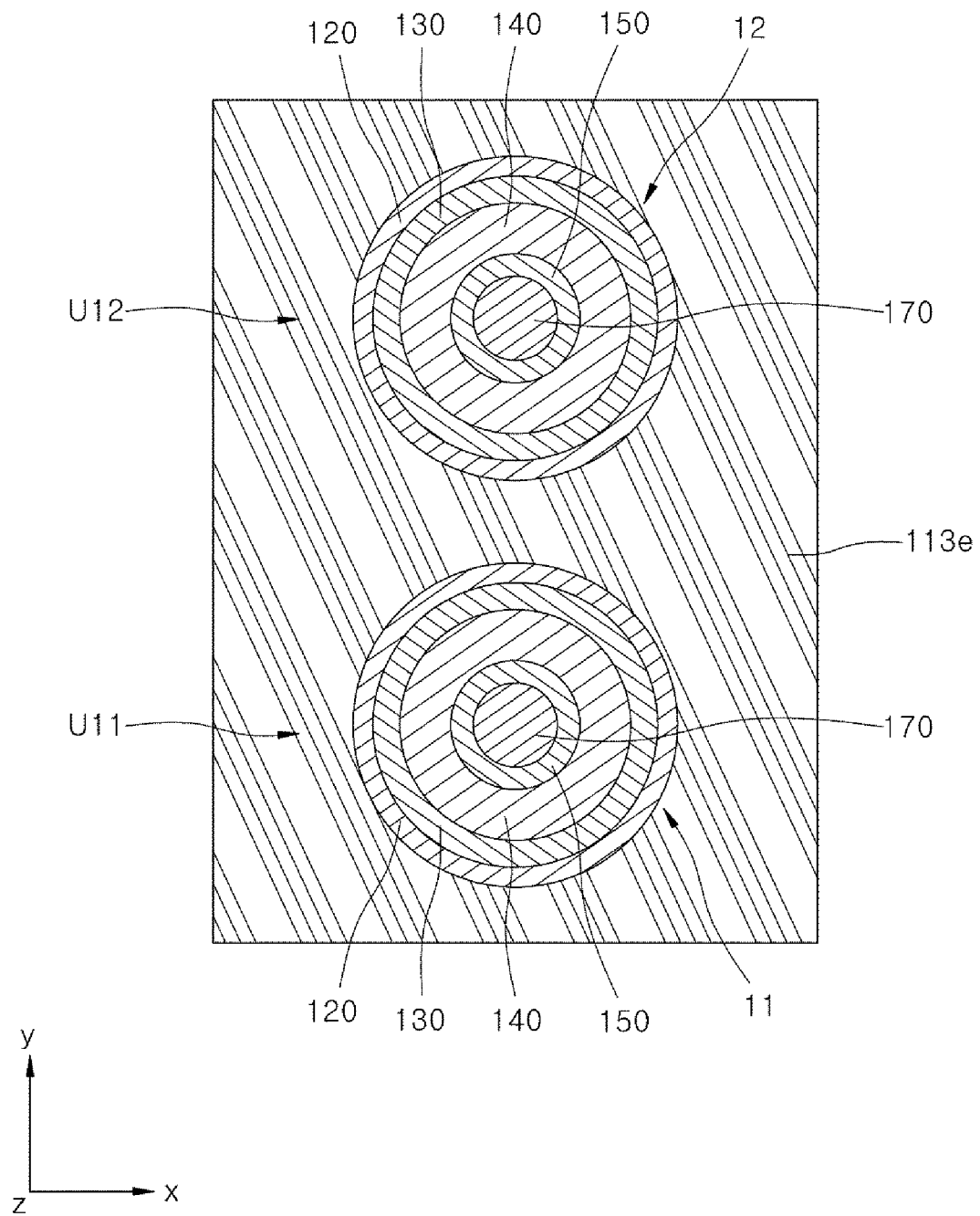
FIG. 2 a plan view of the nonvolatile memory device of FIG. 1.
Figure 3:
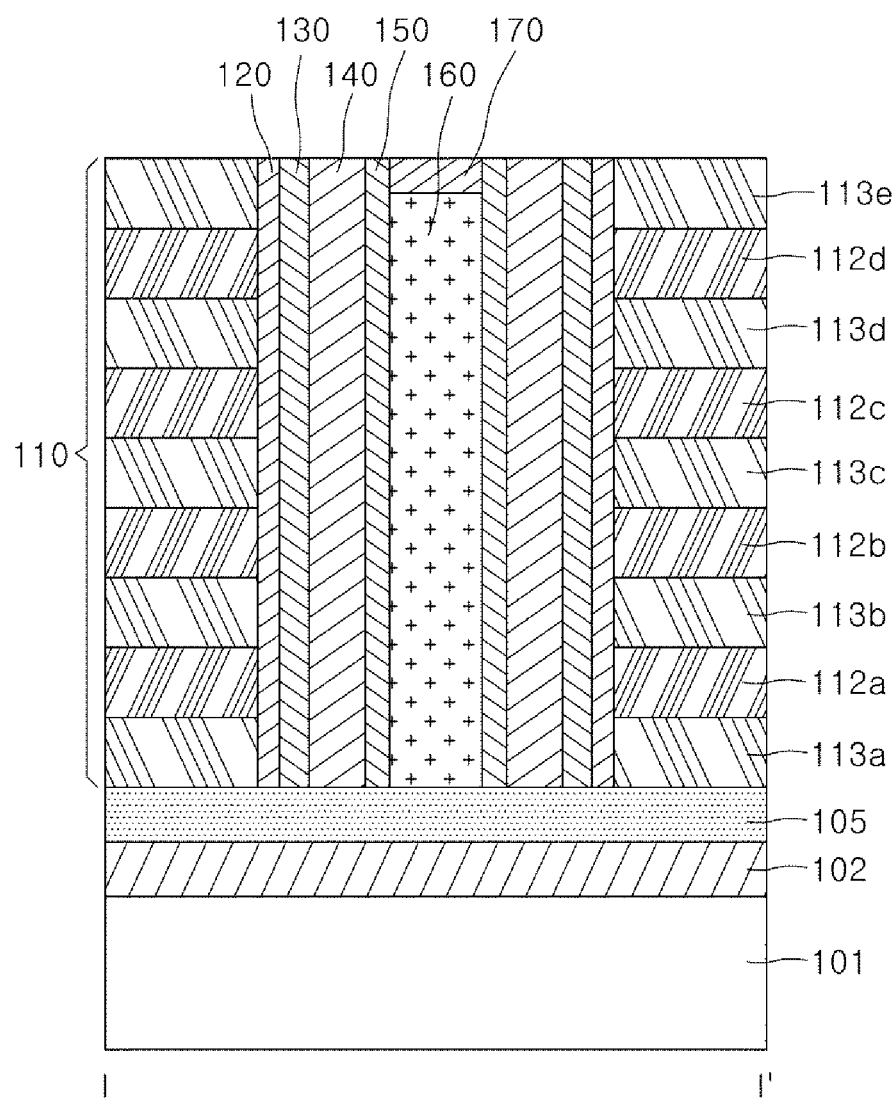
FIG. 3 is a cross-sectional view taken along a line I-I' of the nonvolatile memory device of FIG. 1.

FIG. 1 is a perspective view schematically illustrating a nonvolatile memory device 1 according to an embodiment of the present disclosure. FIG. 2 a plan view of the nonvolatile memory device 1 of FIG. 1. FIG. 3 is a cross-sectional view taken along a line I-I' of the nonvolatile memory device 1 of FIG. 1.

Referring to FIGS. 1 to 3, the nonvolatile memory device 1 may include a substrate 101 and a gate structure 110 disposed on the substrate 101. In addition, the nonvolatile memory device 1 may include first and second hole patterns 11 and 12 that penetrate the gate structure 110 on the substrate 101. The nonvolatile memory device 1 may include a gate insulation layer 120, a first ion retention layer 130, a second ion retention layer 140, and a channel layer 150 that sequentially cover the gate structure 110 inside the first and second hole patterns 11 and 12.

Meanwhile, the nonvolatile memory device 1 may further include a channel lower contact layer 105, on or over the substrate 101, that contacts one end of the channel layer 150. The channel lower contact layer 105 may be electrically connected to a source electrode (not shown). In addition, the nonvolatile memory device 1 may include a channel upper contact layer 170 contacting the other end of the channel layer 150. The other end of the channel layer 150 may be disposed opposite to the one end of the channel layer 150 along a direction perpendicular to an upper or lower surface of the substrate 101 (i.e., a z-direction). The channel upper contact layer 170 may be electrically connected to a drain electrode (not shown). The source electrode and the drain electrode may apply a source-drain voltage to the channel layer 150.

Referring to FIGS. 1 to 3, the substrate 101 may include a semiconductor material. Specifically, the semiconductor material may include silicon (Si), germanium (Ge), gallium arsenic (GaAs), molybdenum selenide (MoSe$_2$), hafnium selenide (HfSe$_2$), indium selenide (InSe), gallium selenide (GaSe), black phosphorus, indium-gallium-zinc oxide (IGZO), or a combination of two or more thereof. The semiconductor material may be doped with a dopant. The semiconductor material may, for example, be doped with an n-type dopant or a p-type dopant.

A base insulation layer 102 may be disposed on or over the substrate 101. The base insulation layer 102 may electrically insulate the channel lower contact layer 105 from the substrate 101. The base insulation layer 102 may include an insulating material. The insulating material may include, for example, oxide, nitride, oxynitride, or a combination of two or more thereof.

The channel lower contact layer 105 may be disposed on or over the base insulation layer 102. The channel lower contact layer 105 may be electrically connected to the channel layer 150. The channel lower contact layer 105 may include a conductive material. The conductive material may include, for example, a doped semiconductor material, metal, conductive metal nitride, conductive metal carbide, conductive metal silicide, or conductive metal oxide. The conductive material may include, for example, n-type doped silicon (Si), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

The gate structure 110 may be disposed on the channel lower contact layer 105. The gate structure 110 may include first to fourth gate electrode layers 112a, 112b, 112c, and 112d, and first to fifth interlayer insulation layers 113a, 113b, 113c, 113d, and 113e, which are alternately stacked along a first direction (i.e., the z-direction). The first interlayer insulation layer 113a may be disposed to contact the channel lower contact layer 105. The fifth interlayer insulation layer 113e may be disposed as an uppermost layer of the gate structure 110.

Each of the first to fourth gate electrode layers 112a, 112b, 112c, and 112d may include a conductive material. The conductive material may include, for example, a doped semiconductor material, metal, conductive metal nitride, conductive metal carbide, conductive metal silicide, or conductive metal oxide. The conductive material may include, for example, n-type doped silicon (Si), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. Each of the first to fifth interlayer insulation layers 113a, 113b, 113c, 113d, and 113e may include an insulating material. The insulating material may include, for example, oxide, nitride, oxynitride, or a combination of two or more thereof.

In some embodiments, the number of the gate electrode layers of the gate structure 110 might not necessarily be limited to four. The gate electrode layers may be disposed in various numbers, and the interlayer insulation layers may insulate the various gate electrode layers from each other along the first direction (i.e., the z-direction).

Referring to FIGS. 1 to 3, the first and second hole patterns 11 and 12 may penetrate through the gate structure 110 in a vertical direction to the channel lower contact layer 105. For example, the first and second hole patterns 11 and 12 may be formed in the first direction (i.e., the z-direction) on the channel lower contact layer 105. In an embodiment, the first and second hole patterns 11 and 12 may be spaced apart from each other in a second direction (i.e., a y-axis direction). The first and second hole patterns 11 and 12 may be formed, for example, by known lithography and etch processes. As described later, the nonvolatile memory device 1 may include first and second memory operation units U11 and U12 that are separated from each other for the first and second hole patterns 11 and 12.

The gate insulation layers 120 covering a sidewall surface of the gate structure 110 may be disposed in each of the first and second hole patterns 11 and 12. The gate insulation layer 120 may serve as a barrier layer preventing material diffusion between the first to fourth gate electrode layers 112a, 112b, 112c, and 112d and the first ion retention layer 130.

In addition, as described below, the gate voltage applied to the first to fourth gate electrode layers 112a, 112b, 112c, and 112d may be provided to the first and second ion retention layers 130 and 140 through the gate insulation layers 120. The gate insulation layers 120 may have a sufficiently small thickness such that the gate voltage can be transferred to the first and second ion retention layers 130 and 140 in a sufficient operational magnitude. Also, the first and second ion retention layers 130 and 140 may request a current driving force of a sufficient magnitude for the ion exchange. For example, the gate voltage may pass through the gate insulation layer 120 to provide a tunneling current of a sufficient magnitude to the first ion retention layer 130 from the first to fourth gate electrode layers 112a, 112b, 112c, and 112d.

The gate insulation layer 120 may include an insulating material. The gate insulation layer 120 may include, for example, silicon oxide, silicon nitride, silicon oxynitride, aluminum oxide, hafnium oxide, and the like.

The first ion retention layer 130 may be disposed on the gate insulation layer 120, which is disposed along the sidewall surface of the gate structure 100 inside the first and second hole patterns 11 and 12. Similarly, the second ion retention layer 140 may be disposed on the first ion retention layer 130 inside the first and second hole patterns 11 and 12. As an example, the gate insulation layer 120, the first ion retention layer 130 and the second ion retention layer 140 may be disposed in sequential concentric layers within the first and second hole patterns 11 and 12.

The first and second ion retention layers 130 and 140 may include ions exchangeable with each other. In an embodiment, the first and second ion retention layers 130 and 140 may include metal cations exchangeable with each other. The metal cations may move between the first ion retention layer 130 and the second ion retention layer 140 when an external electric field is applied.

In an embodiment, when the metal cations are Lithium (Li) ions, each of the first and second ion retention layers 130 and 140 may include, for example, lithium-based oxide, transition metal oxide, a perovskite-based material, or a combination of two or more thereof. The lithium-based oxide may include LiPON, $LiCoO_2$, $LiFePO_4$, $LiMn_2O_4$, and the like. The transition metal oxide may include, for example, $WO_3$, $MoO_3$, and the like. The perovskite-based material may include, for example, $SrTiO_3$, and the like.

In an embodiment, one of the first and second ion retention layers 130 and 140 may function as a supply layer of the metal cation. The other of the first and second ion retention layers 130 and 140 may function as a receiving layer of the metal cation. In an embodiment, one of the first and second ion retention layers 130 and 140 serving as a supply layer of the metal cation may include LiPON, $LiCoO_2$, $LiFePO_4$, $LiMn_2O_4$, and the like, while the other functioning as a receiving layer of the metal cation may include, for example, $WO_3$, $MoO_3$, $SrTiO_3$, and the like.

The first and second ion retention layers 130 and 140 may have different electrical resistances depending on the concentration of the ions. As an embodiment, the first ion retention layer 130 may be a supply layer of the metal cation that retains lithium (Li) ions, and the second ion retention layer 140 may be a receiving layer of the metal cation. For example, the first ion retention layer 130 may include $LiCoO_2$, and the second ion retention layer 140 may include $WO_3$.

When a voltage having a positive polarity is applied to at least one of the first to fourth gate electrode layers 112a, 112b, 112c, and 112d, the lithium (Li) ions of the first ion retention layer 130 may move into the second ion retention layer 140. Inside the second ion retention layer 140, the lithium (Li) ions may be combined with a $WO_3$ material to form a $Li_xWO_{3-x}$ material. In this process, oxygen vacancies may be formed inside the $WO_3$ material. As the concentration of lithium (Li) ions moving from the first ion retention layer 130 to the second ion retention layer 140 increases, the concentration of the oxygen vacancies distributed in the second ion retention layer 140 may increase accordingly. Because the oxygen vacancy has a positive charge and can move along the electric field, the oxygen vacancies can reduce the electrical resistance inside the second ion retention layer 140. Even after removing the positive voltage applied to at least one of the first to fourth gate electrode layers 112a, 112b, 112c, and 112d, the second ion retention layer 140 can maintain the reduced electrical resistance. That is, the second ion retention layer 140 can store, in a non-volatile manner, the reduced electrical resistance in the layer as signal information.

In addition, as the magnitude of the positive voltage applied to at least one of the first to fourth gate electrode layers 112a, 112b, 112c, and 112d increases, the concentration of the lithium (Li) cations moving to the second ion retention layer 140 may also increase. As the concentration of the lithium (Li) cations increases, the electrical resistance inside the second ion retention layer 140 may decrease. That is, the second ion retention layer 140 may have a multi-level electrical resistance based on the amount of the lithium (Li) cations that are retained. The multi-level electrical resistance may be stored, in a non-volatile manner, in the second ion retention layer 140 as multi-level signal information.

Conversely, when a voltage having a negative polarity is applied to at least one of the first to fourth gate electrode layers 112a, 112b, 112c, and 112d, the lithium (Li) cations distributed in the second ion retention layer 140 may move to the first ion retention layer 130. In the second ion retention layer 140, as the amount of the lithium (Li) cations decreases, the concentration of the oxygen vacancies in the WO3 material may also decrease. As a result, the electrical resistance of the second ion retention layer 140 may increase. Even after removing the negative voltage applied to the at least one of the first to fourth gate electrode layers 112a, 112b, 112c, and 112d, the second ion retention layer 140 can maintain the increased electrical resistance. That is, the second ion retention layer 140 can store, in a non-volatile manner, the increased electrical resistance in the layer as signal information.

Meanwhile, as the magnitude of the negative voltage applied to at least one of the first to fourth gate electrode layers 112a, 112b, 112c, and 112d increases, the concentration of the lithium (Li) cations moving from the second ion retention layer 140 to the first ion retention layer 130 may also increase. As the concentration of the lithium (Li) cations moving to the first ion retention layer 130 increases, the electrical resistance of the second ion retention layer 140 may increase. A plurality of different electrical resistance levels may also be used as multi-level signal information.

Referring to FIGS. 1 to 3, the channel layer 150 may be disposed on the channel lower contact layer 105 inside of first and second hole patterns 11 and 12 to cover the second ion retention layer 140. The channel layer 150 may include a semiconductor material. The semiconductor material may include, for example, silicon (Si), germanium (Ge), gallium arsenic (GaAs), or the like. As another example, the semiconductor material may include a two-dimensional semiconductor material. The two-dimensional semiconductor material may include transition metal dichalcogenide (TMDC), black phosphorus, or the like. The transition metal dichalcogenide (TMDC) may include, for example, molybdenum selenide ($MoSe_2$), hafnium selenide ($HfSe_2$), indium selenide (InSe), gallium selenide (GaSe), and the like. The semiconductor material may include, for example, metal oxide such as indium-gallium-zinc oxide (IGZO).

Meanwhile, filling insulation layers 160 may be disposed inside the first and second hole patterns 11 and 12 in which the gate insulation layers 120, the first and second ion retention layers 130 and 140, and the channel layers 150 are disposed. The filling insulation layer 160 may include, for example, oxide, nitride, oxynitride, or a combination of two or more thereof.

The channel upper contact layers 170 may be disposed on the filling insulation layers 160 in the first and second hole patterns 11 and 12. The channel upper contact layers 170 may contact an upper end of the channel layer 150. Each of the channel upper contact layers 170 may be electrically connected to a drain electrode (not shown). In some embodiments, the channel upper contact layers 170 may be disposed outside the first and second hole patterns 11 and 12. As an example, the channel upper contact layers 170 may be disposed on the channel layer 150 to be electrically connected to the channel layer 150.

The channel upper contact layers 170 may include a conductive material. The conductive material may include, for example, a doped semiconductor material, metal, conductive metal nitride, conductive metal carbide, conductive metal silicide, or conductive metal oxide. The conductive material may, for example, include silicon (Si) doped with an n-type dopant or a p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

As described above, in the nonvolatile memory device 1 according to the embodiments of the present disclosure, the first and second hole patterns 11 and 12 may penetrate the gate structure 100, which is disposed on the channel lower contact layer 105. The gate insulation layer 120, the first and second ion retention layers 130 and 140, and the channel layer 150 may be disposed inside the first and second hole patterns 11 and 12. In addition, the channel upper contact layers 170 may be disposed to contact a portion of the channel layer 150 in upper regions of the first and second hole patterns 11 and 12.

In other words, the first to fourth gate electrode layers 112a, 112b, 112c, and 112d and the first to fifth interlayer insulation layers 113a, 113b, 113c, 113d, 113e may be disposed to surround the gate insulation layer 120, the first and second ion retention layer 130 and 140, and the channel layer 150 inside the first and second hole patterns 11 and 12 over the channel lower contact layer 105.

In some embodiments, the number of the hole patterns passing through the gate structure 110 is not necessarily limited to two. The hole patterns may be formed in a variety of different numbers, and each of a gate insulation layer, first and second ion retention layers, a channel layer, a filling insulation layer, a the channel upper contact layer may be disposed inside the hole patterns.

Referring back to FIGS. 1 and 2, the nonvolatile memory device 1 may include first and second memory element units U11 and U12 that perform independent operations for each of the first and second hole patterns 11 and 12, respectively. The first and second memory element units U11 and U12 may share the channel lower contact layer 105. In addition, each of the first and second memory element units U11 and U12 may include the channel upper contact layer 170.

Figure 4:
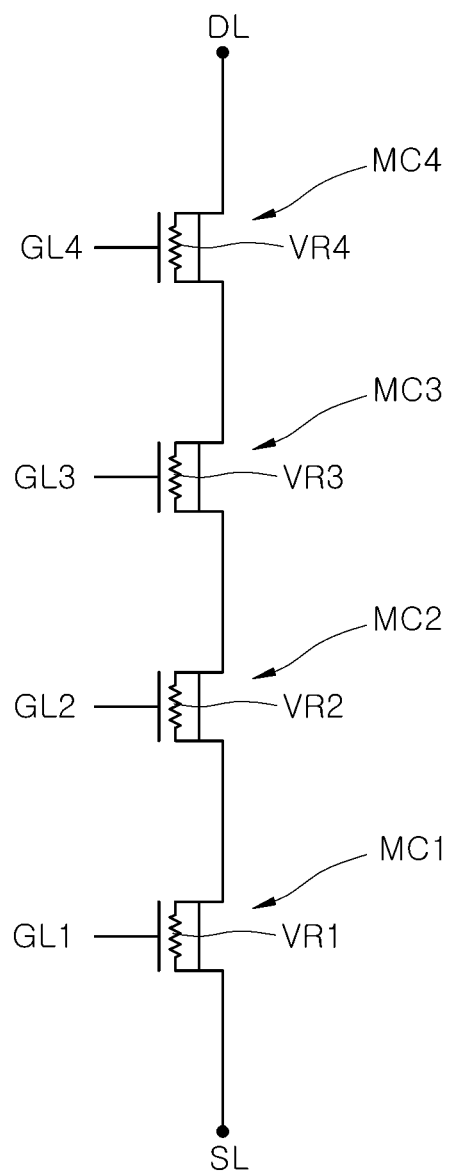
FIG. 4 is a circuit diagram of a nonvolatile memory device according to an embodiment of the present disclosure.

FIG. 4 is a circuit diagram of a nonvolatile memory device according to an embodiment of the present disclosure. The circuit diagram of FIG. 4 may correspond to one of the first and second memory element units U11 and U12 of the nonvolatile memory device 1 described above with reference to FIGS. 1 to 3. That is, the circuit diagrams of the first and second memory elements U11 and U12 may be substantially the same. Hereinafter, as an example, a circuit diagram of the first memory element unit U11 will be described. Specifically, the circuit diagram of FIG. 4 may include representations of the gate insulation layer 120, the first and second ion retention layers 130 and 140, the channel layer 150, and the first to fourth gate electrode layers 112a, 112b, 112c, and 112d in the nonvolatile memory device 1 of FIGS. 1 to 3. Referring to the circuit diagram of FIG. 4, the first memory element unit U11 may include first to fourth memory cells MC1, MC2, MC3, and MC4 each having a form of a transistor.

Referring to FIG. 4, the first to fourth memory cells MC1, MC2, MC3, and MC4 may be connected in series to each other in a string form between a source electrode SL and a drain electrode DL. Each of the first to fourth memory cells MC1, MC2, MC3, and MC4 may include a transistor-type nonvolatile memory element. The first to fourth memory cells MC1, MC2, MC3 and MC4 may include first to fourth resistive element layers VR1, VR2, VR3 and VR4, respectively, disposed between the gate insulation layers of the transistors and the conductive channels.

In FIGS. 1 to 3, the channel lower contact layer 105 and the channel upper contact layer 170 may be electrically connected to the source electrode (not shown) and the drain electrode (not shown), respectively. Here, the source electrode and the drain electrode may correspond to the source electrode SL and the drain electrode DL of FIG. 4, respectively. The first to fourth gate electrode layers 112a, 112b, 112c, and 112d of FIGS. 1 to 3 may correspond to the first to fourth gate electrodes GL1, GL2, GL3, and GL4 of FIG. 4, respectively. In FIGS. 1 to 3, the regions of the first and second ion retention layers 130 and 140 controlled by the first to fourth gate electrode layers 112a, 112b, 112c, and 112d may correspond to the first to fourth resistive element layers VR1, VR2, VR3, and VR4, respectively.

FIGS. 5A to 5F are views schematically explaining operations of a nonvolatile memory device according to embodiments of the present disclosure. Operation methods of the nonvolatile memory device to be described with reference to FIGS. 5A to 5F will be described using the nonvolatile memory device 1 described above with reference to FIGS. 1 to 3. In addition, for the convenience of explanation, the operations of the nonvolatile memory device will be described, for example, using the configuration of the nonvolatile memory 1 that corresponds to the third memory cell MC3 having the third resistive element layer VR3 of the circuit diagram of FIG. 4.

Figure 5A:
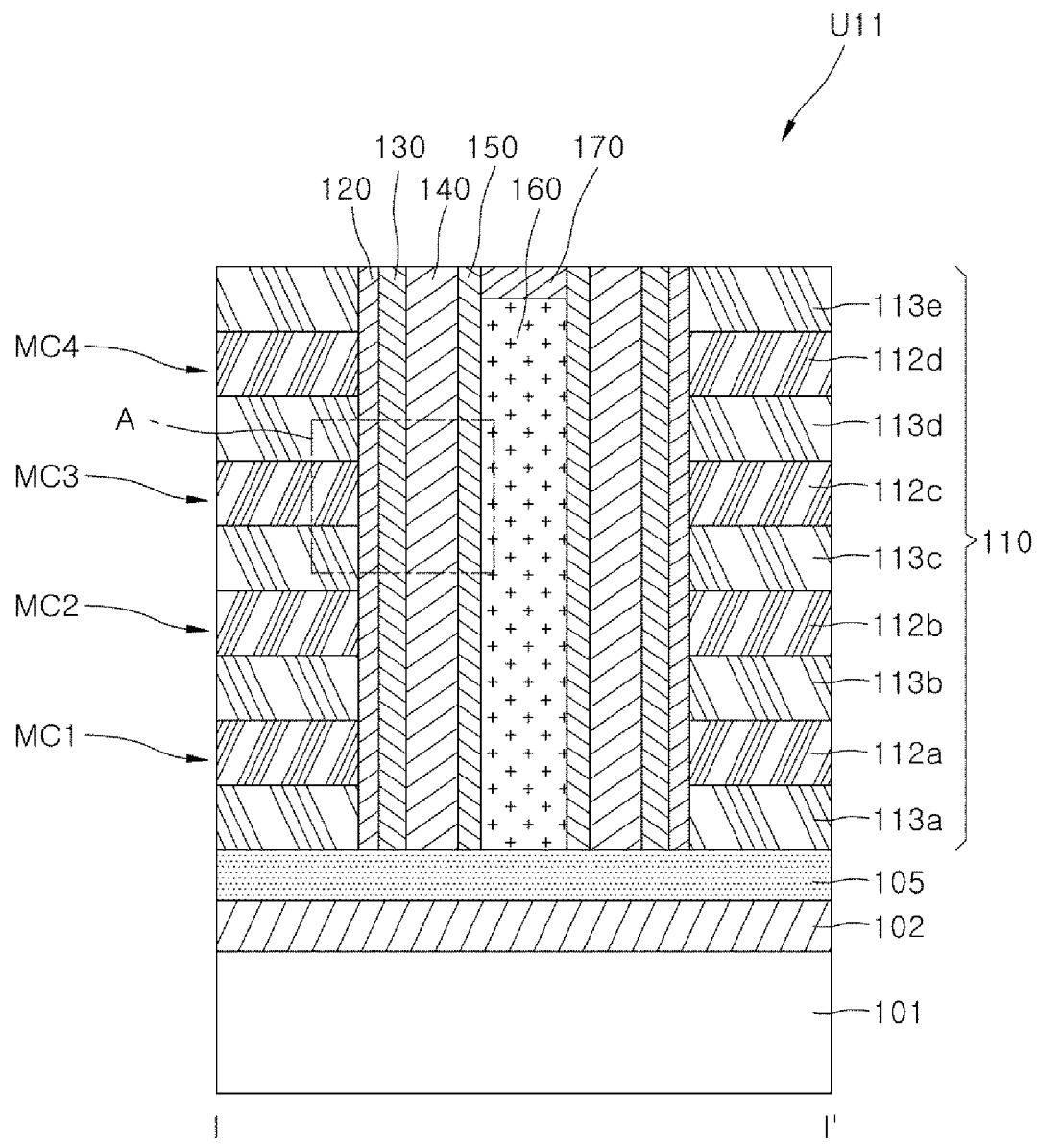
FIGS. 5A to 5F are views schematically explaining operations of a nonvolatile memory device according to embodiments of the present disclosure.
Figure 5B:
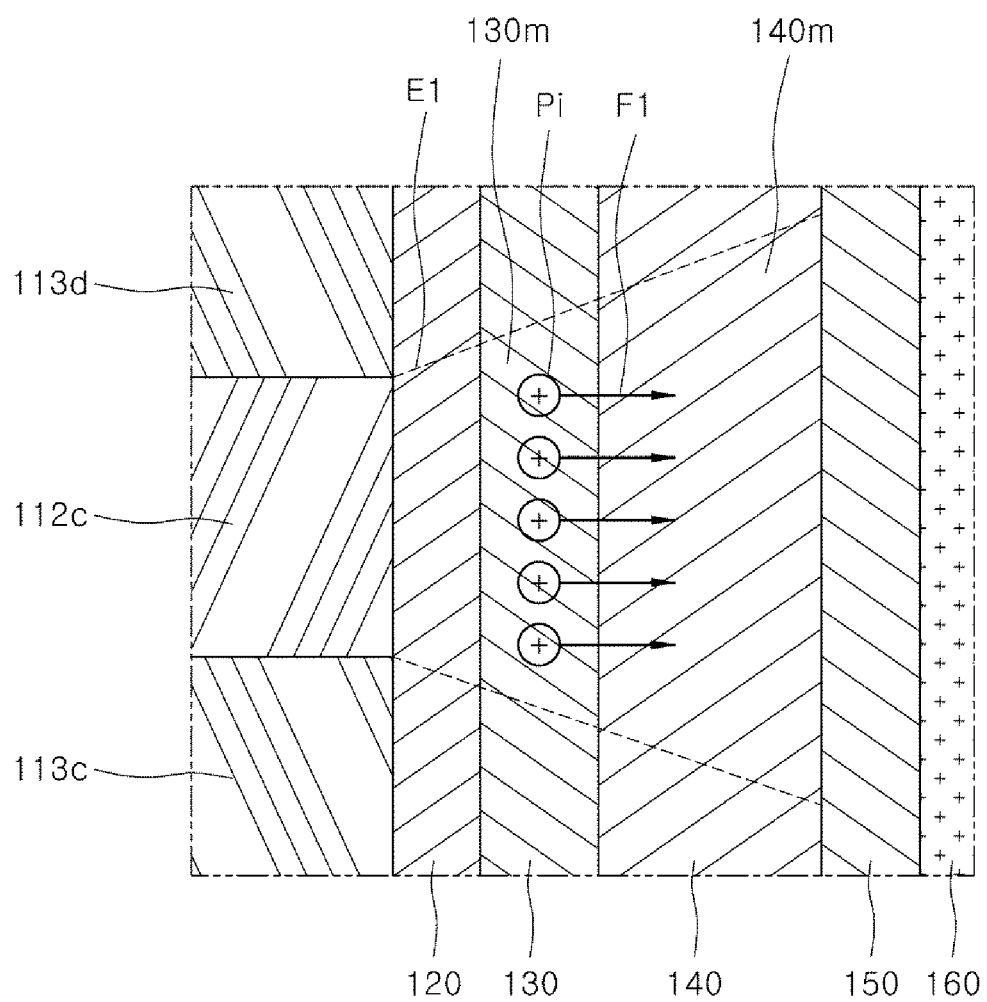
Figure 5C:
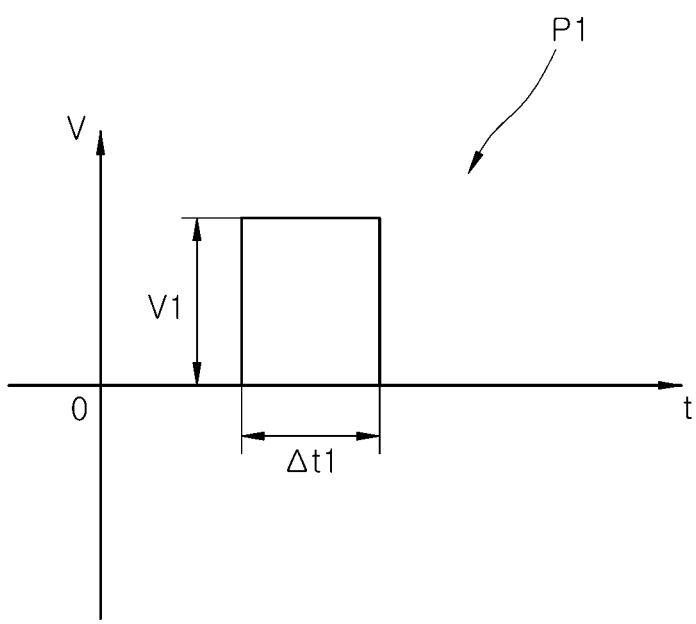
Figure 5D:
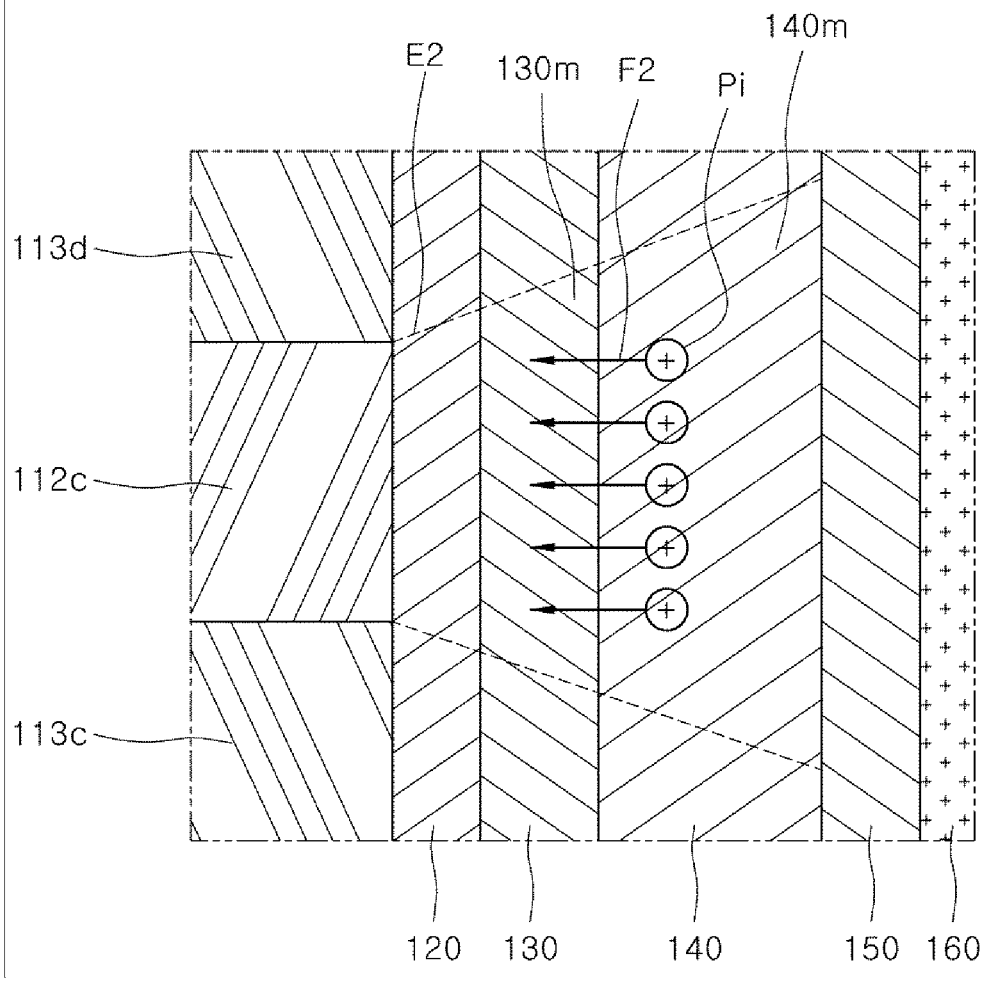
Figure 5E:
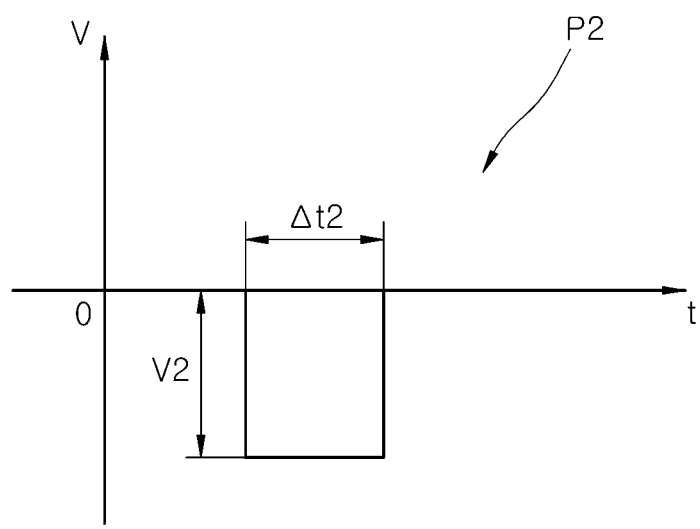
Figure 5F:
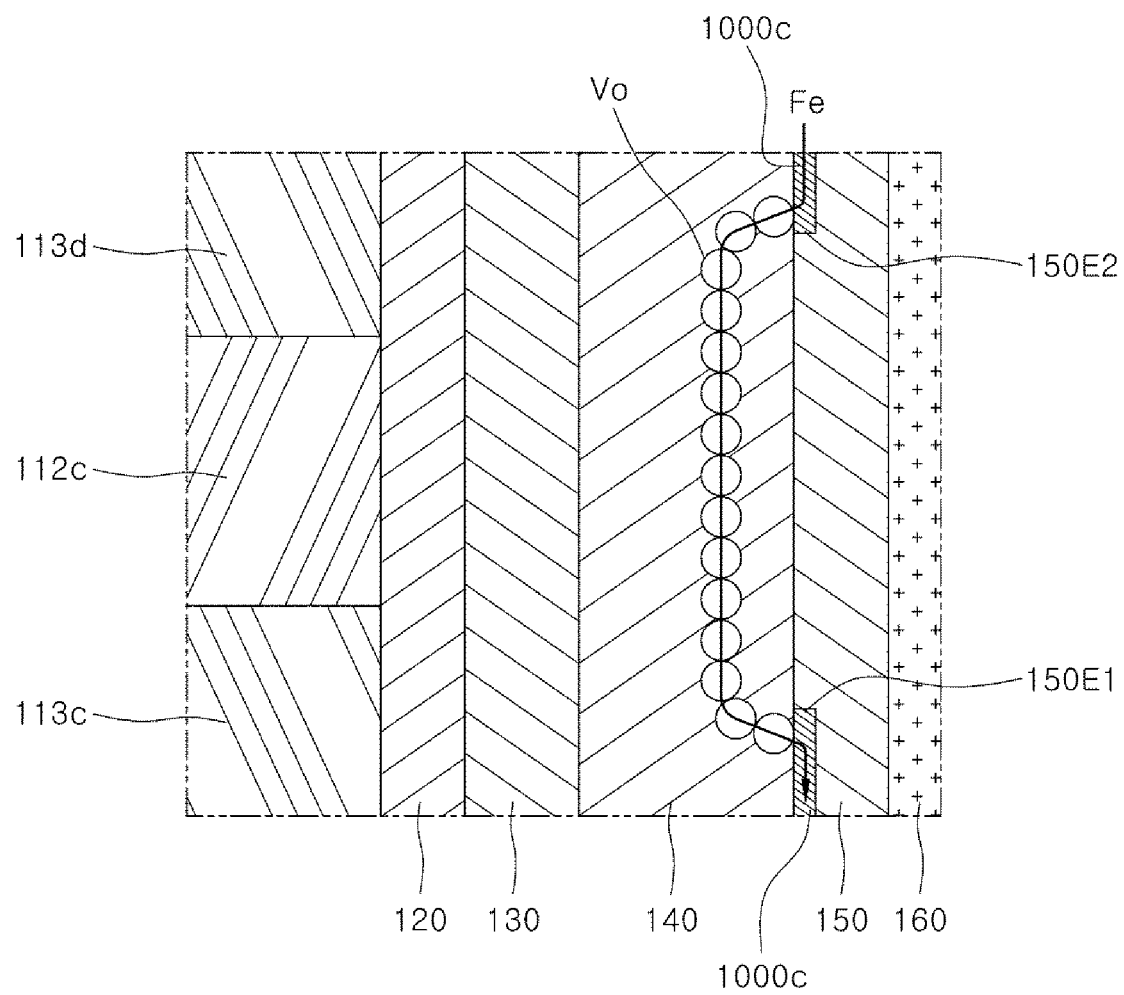

Specifically, FIG. 5A is a cross-sectional view of the nonvolatile memory device 1 illustrated in FIG. 3 with a first memory operation unit U11. FIG. 5B is a view illustrating a first write operation for the third memory cell MC3 in a region 'A' of FIG. 5A. FIG. 5C is a view schematically illustrating the shape of a gate voltage for the first write operation. FIG. 5D is a view illustrating a second write operation for the third memory cell MC3 in the region 'A' of FIG. 5A. FIG. 5E is a view schematically illustrating the shape of a gate voltage for the second write operation. FIG. 5F is a view illustrating a read operation for the third memory cell MC3 in the region 'A' of FIG. 5A. The third resistive element layer VR3 may correspond to the portions of the first and second ion retention layers 130 and 140, which are controlled by the third gate electrode layer 112c of FIG. 5A.

In an embodiment, the first ion retention layer 130 may be a layer that supplies metal cations. The second ion retention layer 140 may be a receiving layer that receives the metal cations. The third memory cell MC3 of the nonvolatile memory device 1 may store, in a non-volatile manner, different electrical resistance states depending on the concentration of the metal cations in the second ion retention layer 140. As an example, a first write operation in which the second ion retention layer 140 has a relatively low resistance state will be described with reference to FIGS. 5A to 5C. The first write operation may be referred to as a program operation. As another example, a second write operation in which the second ion retention layer 140 has a relatively high resistance state will be described with reference to FIGS. 5A, 5D, and 5E. The second write operation may be referred to as an erase operation. As yet another example, a read operation for reading out the resistance state stored in the second ion retention layer 140 of the third memory cell MC3 will be described with reference to FIGS. 5A and 5F.

Referring to FIGS. 5A and 5B, for the first write operation with respect to the third memory cell MC3, a predetermined first gate voltage including a bias of a positive polarity may be applied to the third gate electrode layer 112c. At this time, the channel layer 150 may be grounded. Referring to FIG. 5B, a first electric field E1 formed by the first gate voltage may act on the first and second ion retention layers 130 and 140 of the third memory cell MC3. The first electric field E1 may act on memory functional portions 130m and 140m of the first and second ion retention layers 130 and 140.

By the first electric field E1, metal cations Pi may move from the first ion retention layer 130 to the second ion retention layer 140. In FIG. 5B, the movement of the metal cations Pi is illustrated as "F1". Accordingly, the concentration of the metal cations Pi of the first ion retention layer 130 may decrease and the concentration of the metal cations Pi of the second ion retention layer 140 may increase. As described above, as the concentration of the metal cations Pi of the second ion retention layer 140 increases, the concentration of oxygen vacancies in the second ion retention layer 140 may increase. As a result, the electrical resistance inside the second ion retention layer 140 may be decreased.

Subsequently, the first gate voltage may be removed from the third gate electrode layer 112c. After the first gate voltage is removed, the changed concentration of the metal cations Pi in the memory functional portions 130m and 140m of the first and second ion retention layers 130 and 140, corresponding to the third memory cell MC3 can be maintained. Accordingly, the memory functional portion 140m of the second ion retention layer 140 can store the decreased electrical resistance in a non-volatile manner.

In an embodiment, the first gate voltage may be removed after being applied using a positive pulse voltage P1 having a unit amplitude V1 for a unit time width Δt1, as illustrated in FIG. 5C. The magnitude of the first gate voltage may be determined according to the number of times the pulse voltage P1 is applied. That is, it is possible to derive a decrease in electrical resistance inside the second ion retention layer 140 by the application of one pulse voltage P1. Accordingly, in consideration of the decrease in electrical resistance, the magnitude of the first gate voltage may be controlled by the number of times the pulse voltage P1 is applied. As a result, by controlling the magnitude of the first gate voltage using the pulse voltage P1, different electrical resistances can be written in the second ion retention layer 140, and a plurality of different electrical resistances can be stored in the second ion retention layer 140 as different signal information. In other words, the second ion retention layer 140 may have a plurality of different electrical resistances as signal information, based on the amount of increase in the metal cations Pi according to the magnitude of the first gate voltage.

Meanwhile, referring to FIGS. 5A and 5D, for the second write operation with respect to the third memory cell MC3, a predetermined second gate voltage having a bias of a negative polarity may be applied to the third gate electrode layer 112c. At this time, the channel layer 150 may be grounded. Referring to FIG. 5D, a second electric field E2 formed by the second gate voltage may act on the first and second ion retention layers 130 and 140. The second electric field E2 may act on memory functional portions 130m and 140m of the first and second ion retention layers 130 and 140 corresponding to the third memory cell MC3.

By the second electric field E2, metal cations Pi may move from the second ion retention layer 140 to the first ion retention layer 130. In FIG. 5D, the movement of the metal cations Pi is illustrated as "F2". Accordingly, the concentration of the metal cations Pi of the second ion retention layer 140 may decrease and the concentration of the metal cations Pi of the first ion retention layer 130 may increase. As described above, as the concentration of the metal cations Pi of the second ion retention layer 140 decreases, the concentration of oxygen vacancies in the second ion retention layer 140 may decrease. As a result, the electrical resistance inside the second ion retention layer 140 may be increased.

Subsequently, the second gate voltage may be removed from the third gate electrode layer 112c. After the second gate voltage is removed, the changed concentration of the metal cations Pi in the memory functional portions 130m and 140m of the first and second ion retention layers 130 and 140, corresponding to the third memory cell MC3 can be maintained. Accordingly, the memory functional portion 140m of the second ion retention layer 140 can store the increased electrical resistance in a non-volatile manner.

In an embodiment, the second gate voltage may be removed after being applied using a negative pulse voltage P2 having a unit amplitude V2 for a unit time width Δt2, as illustrated in FIG. 5E. The magnitude of the second gate voltage may be determined according to the number of times the pulse voltage P2 is applied. That is, it is possible to derive an increase in electrical resistance inside the second ion retention layer 140 by the application of one pulse voltage P2. Accordingly, in consideration of the increase in electrical resistance, the magnitude of the second gate voltage can be controlled by the number of times the pulse voltage P2 is applied. As a result, by controlling the magnitude of the second gate voltage using the pulse voltage P2, the magnitude of the electrical resistance inside the second ion retention layer 140 can be effectively controlled, and different levels of electrical resistance can be stored as multi-level signal information.

Meanwhile, referring FIGS. 5A and 5F, for the read operation with respect to the third memory cell MC3, a read voltage of a predetermined threshold voltage or higher may be applied to the first gate electrode layer 112a, the second gate electrode layer 112b, and the fourth gate electrode layer 112d. However, the voltage might not be applied to the third gate electrode layer 112c. The read voltage may have a magnitude smaller than the absolute values of the first and second write voltages. Accordingly, the exchange of metal cations might not occur between the first and second ion retention layers 130 and 140 of third memory cell MC3 by applying the read voltage.

As the read voltage is applied, a conductive channel 1000c may be formed in channel layer 150 in a region at or near the interface with second ion retention layer 140, however, the conductive channel 1000c may be electrically disconnected in the portion of the channel layer 150 electrically controlled by the third gate electrode layer 112c. That is, the conductive channel 1000c may be continuously formed, in the channel layer 150, between the channel lower contact layer 105 and the channel upper contact layer 170, except for the disconnected portion of the conductive channel 1000c. That portion can be electrically controlled by the third gate electrode layer. FIG. 5F illustrates the disconnected ends of the conductive channel 1000c as a first disconnection portion 150E1 and a second disconnection portion 150E2.

Subsequently, a source-drain voltage may be applied between the channel lower contact layer 105 and the channel upper contact layer 170. Accordingly, a current may flow along the conductive channel 1000c. However, the current may flow through the second ion retention layer 140 between the first disconnection portion 150E1 and the second disconnection portion 150E2 of the conductive channel 1000c. That is, the internal resistance of the second ion retention layer 140 may be smaller than that of the channel layer 150, in which the conductive channel 1000c does not formed. As described above, the concentration of oxygen vacancies in the second ion retention layer 140 may be determined according to the concentration of the metal cations Pi inside the second ion retention layer 140. In addition, the concentration of the oxygen vacancies may determine the internal resistance of the second ion retention layer 140.

As a result, while the read voltage is applied to the first gate electrode layer 112a, the second gate electrode layer 112b, and the fourth gate electrode layer 112d, but not to the third gate electrode layer 112c, the current flowing between the channel lower contact layer 105 and the channel upper contact layer 170 is measured using the source-drain voltage. The current flows through the oxygen vacancies in the second ion retention layer 140 of the third memory cell MC3 such that the current includes or reflects the resistance information stored in the memory functional portion 140m of the second ion retention layer 140. FIG. 5F illustrates the current flow as "Fe" and illustrates that the current flows through the oxygen vacancies Vo inside the second ion retention layer 140.

Figure 6:
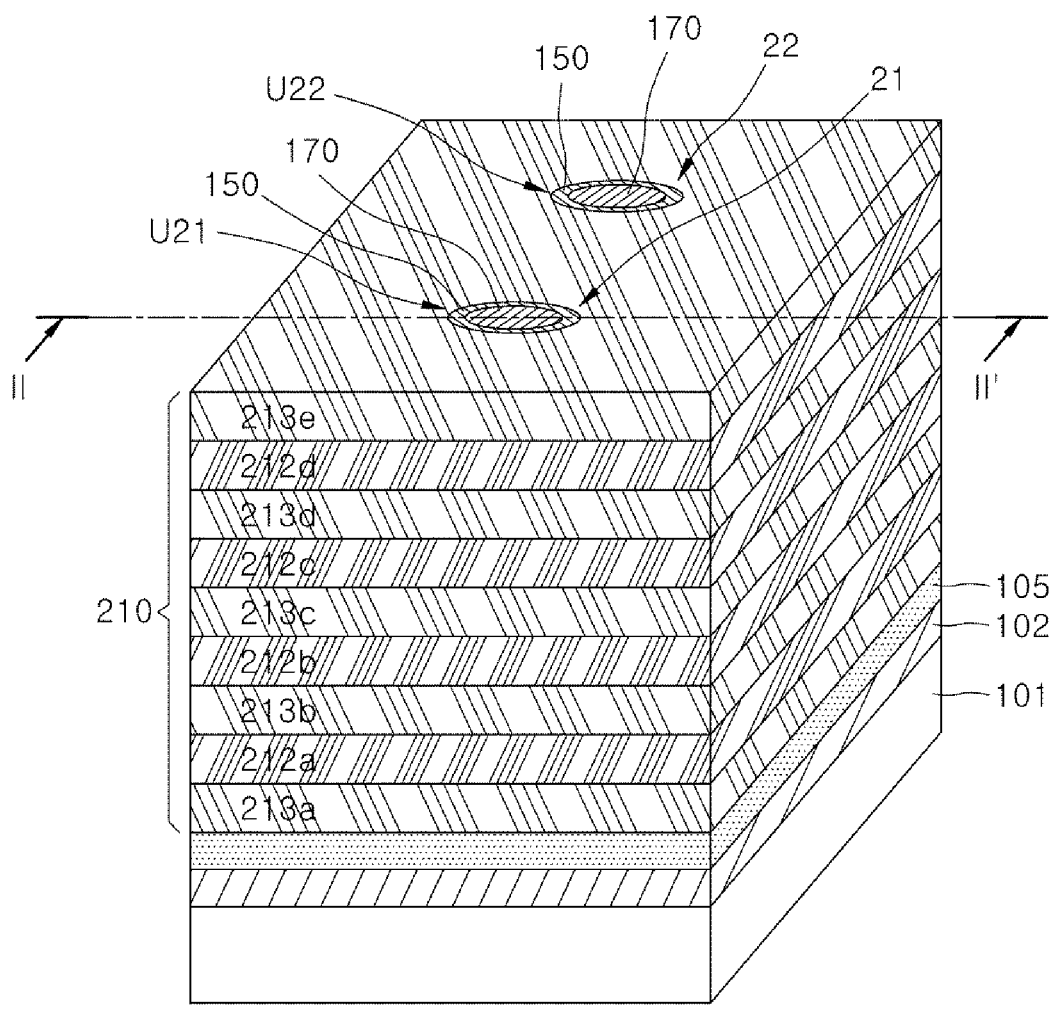
FIG. 6 is a perspective view schematically illustrating a nonvolatile memory device according to another embodiment of the present disclosure.
Figure 7:
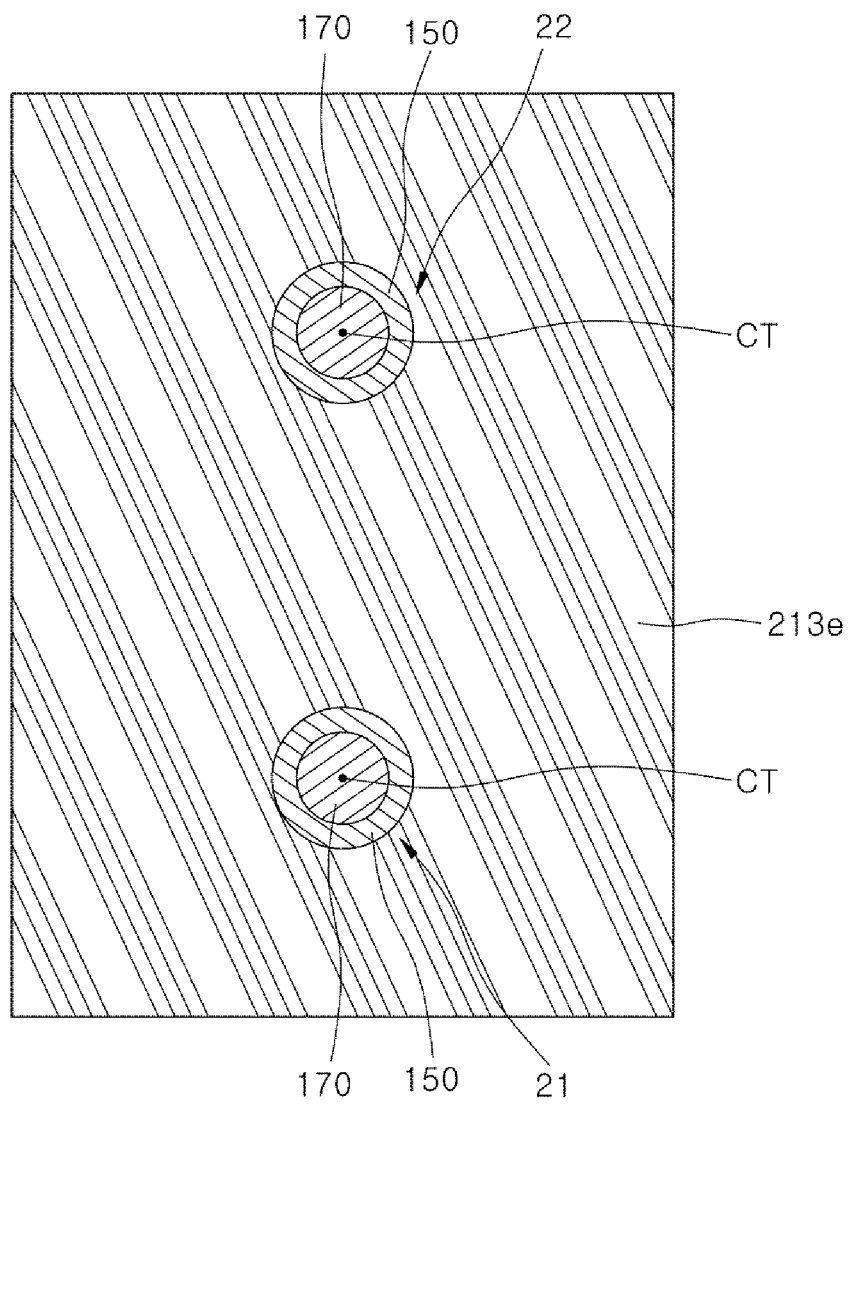
FIG. 7 is a plan view of the nonvolatile memory device of FIG. 6.
Figure 8:
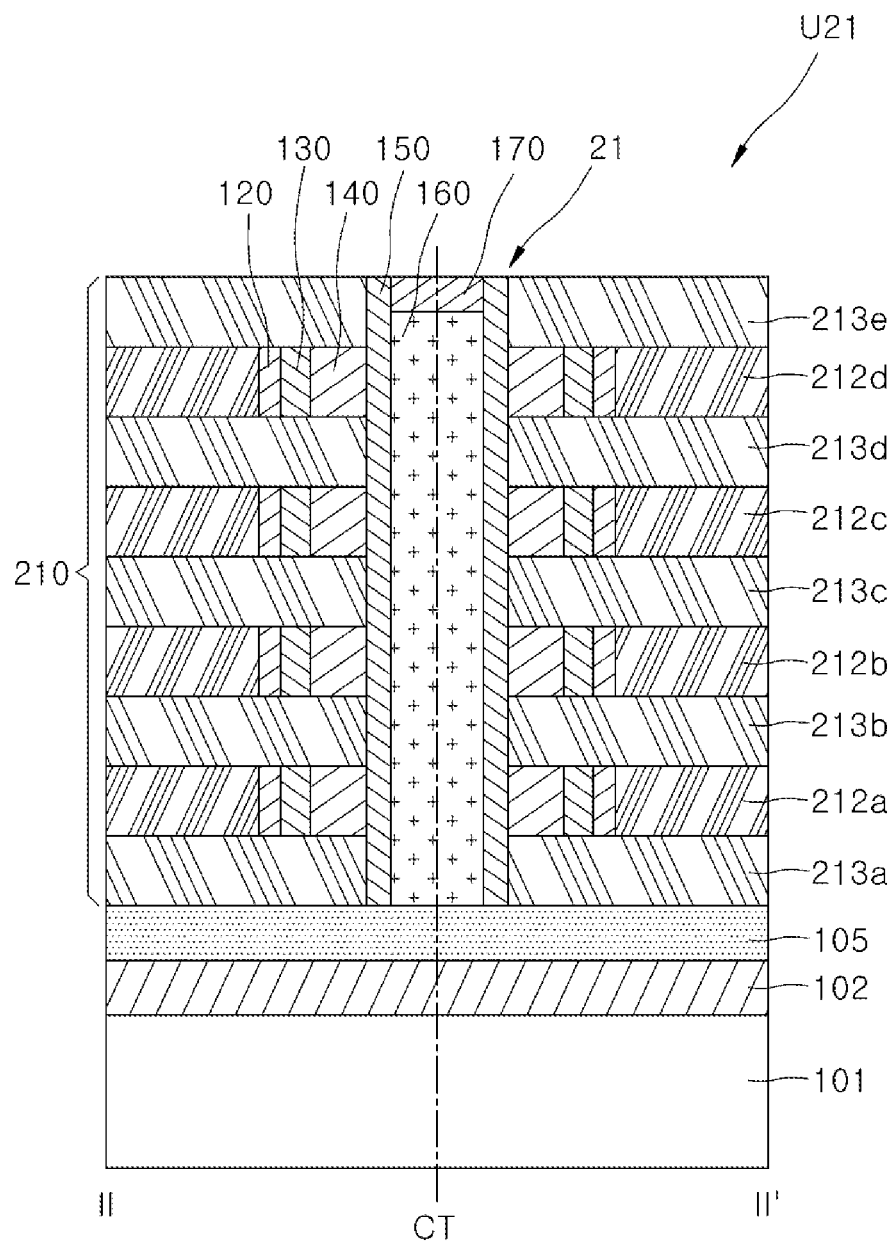
FIG. 8 is a cross-sectional view taken along a line II-II' of the nonvolatile memory device of FIG. 6.

FIG. 6 is a perspective view schematically illustrating a nonvolatile memory device 2 according to another embodiment of the present disclosure. FIG. 7 is a plan view of the nonvolatile memory device 2 of FIG. 6. FIG. 8 is a cross-sectional view taken along a line II-II' of the nonvolatile memory device 2 of FIG. 6.

Referring to FIGS. 6 to 8, the nonvolatile memory device 2 may be different from the nonvolatile memory device 1 described above with reference to FIGS. 1 to 3 in the configuration of a gate structure 210. The configuration of the nonvolatile memory device 2 excluding the gate structure 210 may be substantially the same as that of the nonvolatile memory device 1.

The gate structure 210 may be disposed on a channel lower contact layer 105. The gate structure 210 may include first to fourth gate electrode layers 212a, 212b, 212c, and 212d and first to fifth interlayer insulation layers 213a, 213b, 213c, 213d, and 213e, which are alternately stacked along a first direction (i.e., the z-direction) perpendicular to a substrate 101. The first interlayer insulation layer 213a may be disposed to contact the channel lower contact layer 105. The fifth interlayer insulation layer 213e may be disposed as an uppermost layer of the gate structure 210.

The gate structure 210 may include hole patterns 21 and 22. A gate insulation layer 120, a first ion retention layer 130, and a second ion retention layer 140 may be disposed to sequentially cover the sidewall surfaces of the first to fourth gate electrode layers 212a, 212b, 212c, and 212d in each of the hole patterns 21 and 22. As an example, the gate insulation layer 120, the first ion retention layer 130 and the second ion retention layer 140 may be disposed in sequential concentric layers within the first and second hole patterns 21 and 22. The second ion retention layer 140 may contact a channel layer 150 in a direction perpendicular to the first direction (i.e., in the x-direction and in the y-direction), or in a radial direction from center CT.

Referring to FIGS. 6 to 8, the first to fifth interlayer insulation layers 213a, 213b, 213c, 213d, and 213e of the present embodiment may further extend toward the center CT of each of the hole patterns 21 and 22, compared to the first to fifth interlayer insulation layers 113a, 113b, 113c, 113d, and 113e of the nonvolatile memory device 1 described above with reference to FIGS. 1 to 3. Specifically, the first to fifth interlayer insulation layers 213a, 213b, 213c, 213d, and 213e may be disposed to contact the channel layer 150. The center CT of each of the hole patterns 21 and 22 may refer to the center point of each of the circular hole patterns 21 and 22 in the plan view of FIG. 7, and may refer to a central axis inside the hole pattern 21, extending in a direction perpendicular to an upper or lower surface of the substrate 101 and through the nonvolatile memory device 2, as shown in the cross-sectional view of FIG. 8.

The first to fifth interlayer insulation layers 213a, 213b, 213c, 213d, and 213e of the present embodiment may divide the gate insulation layer 120, the first ion retention layer 130, and the second ion retention layer 140 in the z-direction. As a result, a region of the gate insulation layer 120, a region of the first ion retention layer 130, and a region of the second ion retention layer 140 that are controlled by a gate electrode layer can be separated from regions controlled by a different gate electrode layer. Thus, the first to fourth gate electrode layers 212a, 212b, 212c, and 212d, and corresponding regions of the gate insulation layer 120, the first ion retention layer 130, and the second ion retention layer 140 for each of the gate electrode layers may be separated from each other in the z-direction. In other words, it is possible to prevent the regions of the gate insulation layer 120, the first ion retention layer 130, and the second ion retention layer 140 from interference or control by neighboring gate electrode layers among the first to fourth gate electrode layers 212a, 212b, 212c, and 212d, thereby preventing redundant or double control. Accordingly, electrical interference occurring between neighboring memory cells along the z-direction can be effectively excluded with the extension of first to fifth interlayer insulation layers 213a, 213b, 213c, 213d, and 213e toward center CT.

Figure 9:
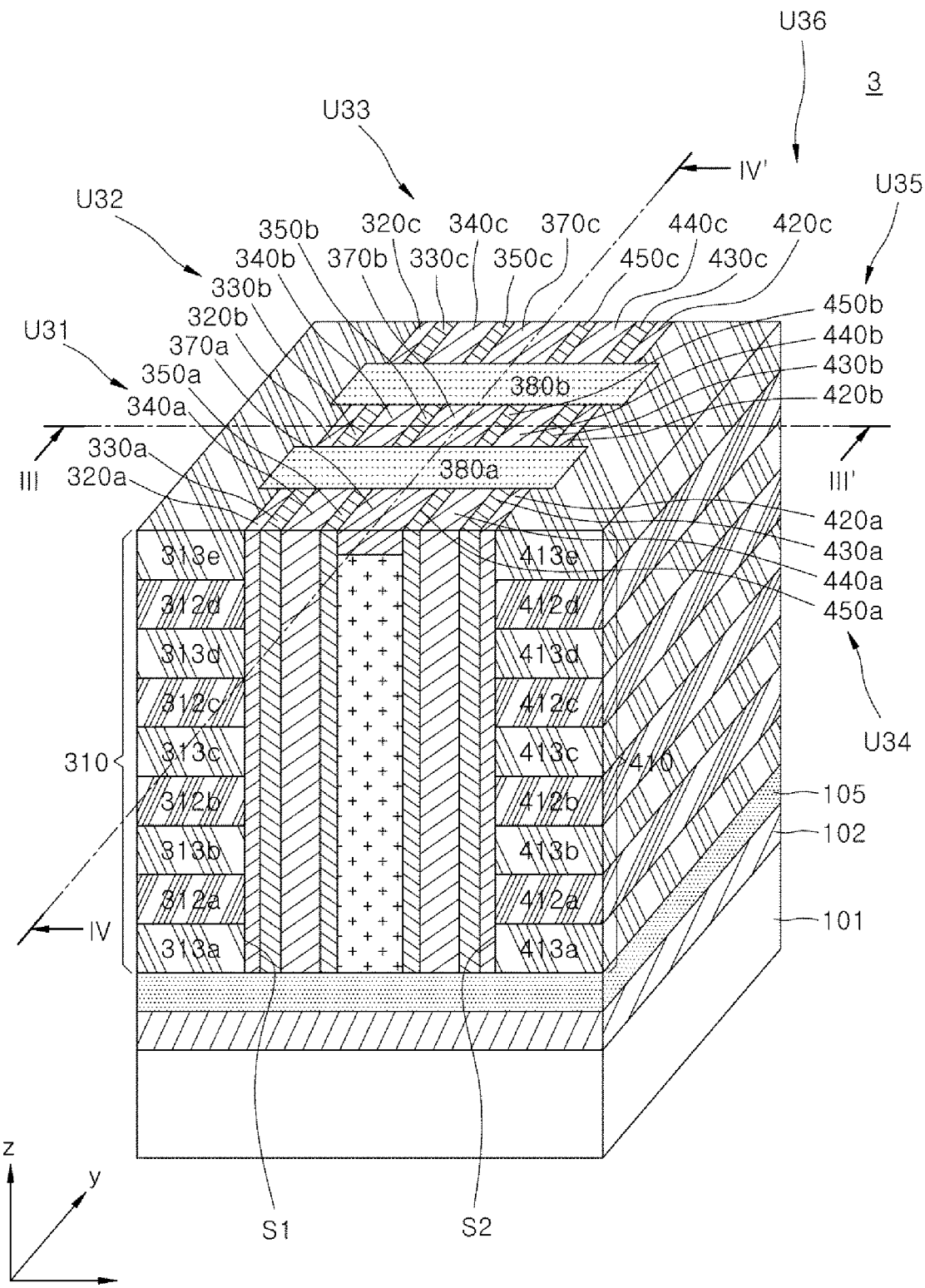
FIG. 9 is a perspective view schematically illustrating a nonvolatile memory device according to yet another embodiment of the present disclosure.
Figure 10:
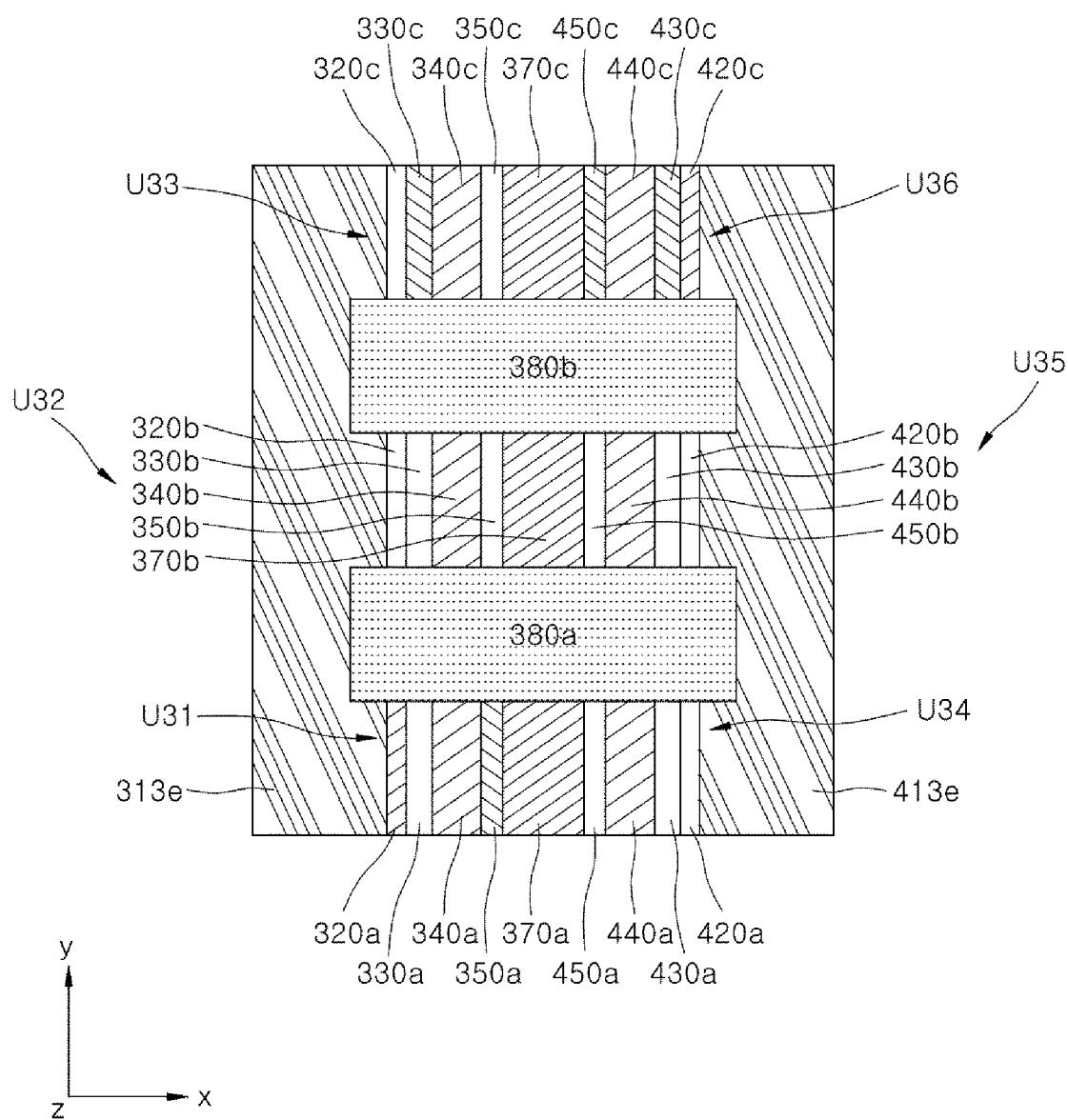
FIG. 10 is a plan view of the nonvolatile memory device of FIG. 9.
Figure 11:
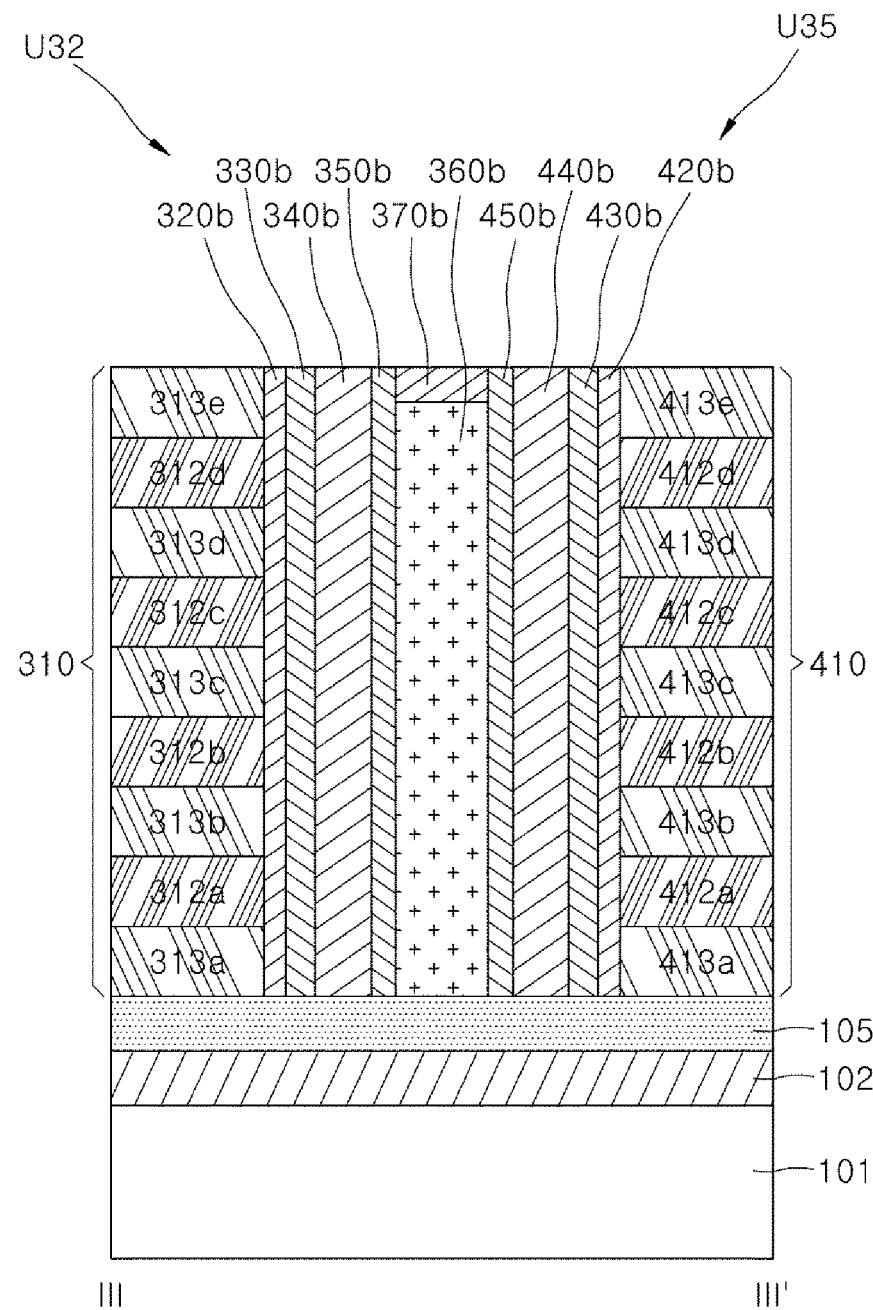
FIG. 11 is a cross-sectional view taken along a line III-III' of the nonvolatile memory device of FIG. 9.
Figure 12:
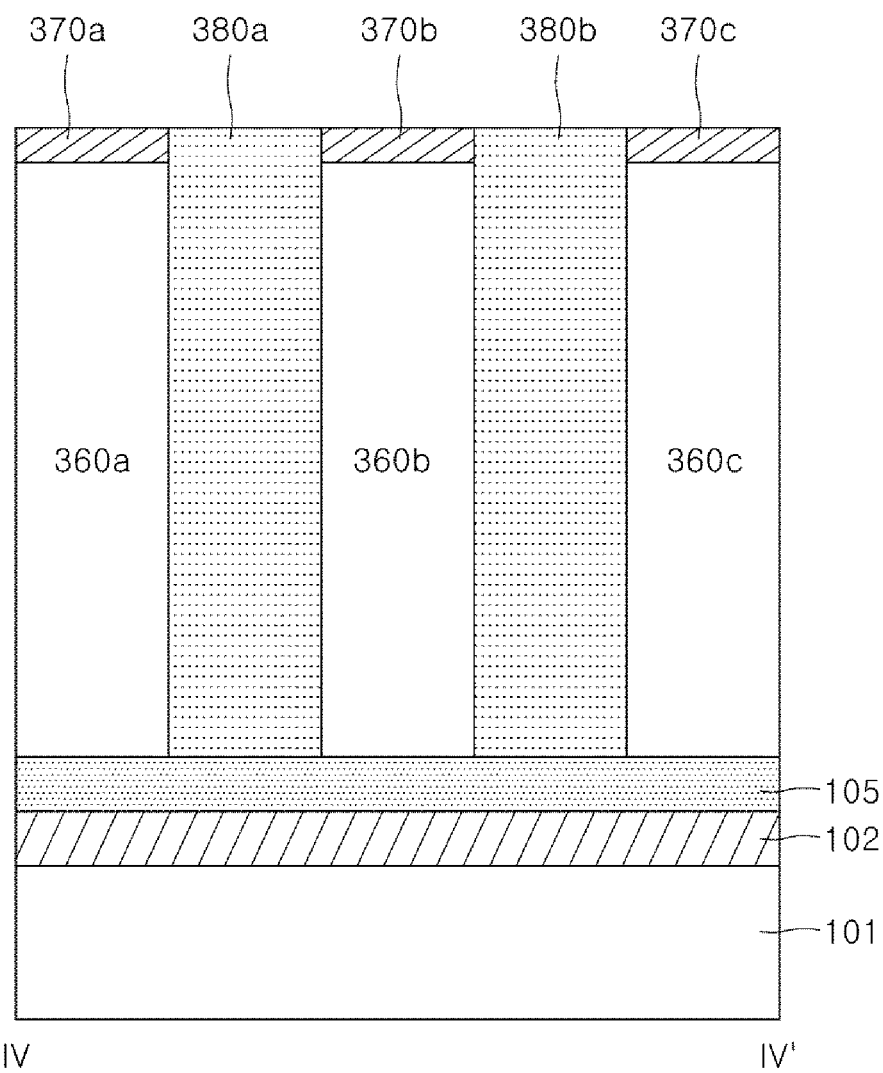
FIG. 12 is a cross-sectional view taken along a line IV-IV' of the nonvolatile memory device of FIG. 9.

FIG. 9 is a perspective view schematically illustrating a nonvolatile memory device 3 according to yet another embodiment of the present disclosure. FIG. 10 is a plan view of the nonvolatile memory device 3 of FIG. 9. FIG. 11 is a cross-sectional view taken along a line III-III' of the nonvolatile memory device 3 of FIG. 9. FIG. 12 is a cross-sectional view taken along a line IV-IV' of the nonvolatile memory device 3 of FIG. 9.

Referring to FIGS. 9 to 12, the nonvolatile memory device 3 may include a substrate 101, and first and second gate structures 310 and 410 disposed on the substrate 101. The nonvolatile memory device 3 may include gate insulation layers 320a, 320b, and 320c, first ion retention layers 330a, 330b, and 330c, second ion retention layers 340a, 340b, and 340c, and channel layers 350a, 350b, and 350c disposed on the substrate 101. The gate insulation layers 320a, 320b, and 320c, first ion retention layers 330a, 330b, and 330c, second ion retention layers 340a, 340b, and 340c, and channel layers 350a, 350b, and 350c sequentially cover a sidewall surface of the first gate structure 310.

In addition, the nonvolatile memory device 3 may include gate insulation layers 420a, 420b, and 420c, first ion retention layers 430a, 430b, and 430c, second ion retention layers 440a, 440b, and 440c, and channel layers 450a, 450b, and 450c disposed on the substrate 101. The gate insulation layers 420a, 420b, and 420c, first ion retention layers 430a, 430b, and 430c, second ion retention layers 440a, 440b, and 440c, and channel layers 450a, 450b, and 450c sequentially cover a sidewall surface of the second gate structure 410 on the substrate 101.

Referring to FIGS. 9 to 12, the substrate 101 may be provided. A base insulation layer 102 and a channel lower contact layer 105 may be sequentially disposed on the substrate 101. The first gate structure 310 may be disposed on the channel lower contact layer 105. The first gate structure 310 may include first to fourth gate electrode layers 312a, 312b, 312c, and 312d and first to fifth interlayer insulation layers 313a, 313b, 313c, 313d, and 313e, which are alternately stacked along a first direction (i.e., the z-direction). The first gate structure 310 may extend in a second direction (i.e., the y-direction) perpendicular to a first direction (i.e., the z-direction).

Each of the first to fourth gate electrode layers 312a, 312b, 312c, and 312d may include a conductive material. The conductive material of each of the first to fourth gate electrode layers 312a, 312b, 312c, and 312d may be substantially the same as the conductive material of the first to fourth gate electrode layers 112a, 112b, 112c, and 112d of the nonvolatile memory device 1 described above with reference to FIGS. 1 to 3. Each of the first to fifth interlayer insulation layers 313a, 313b, 313c, 313d, and 313e may include an insulating material. The insulating material of each of the first to fifth interlayer insulation layers 313a, 313b, 313c, 313d, and 313e may be substantially the same as the insulating material of the first to fifth interlayer insulation layers 113a, 113b, 113c, 113d, and 113e of the nonvolatile memory device 1 described above with reference to FIGS. 1 to 3.

In some embodiments, the number of the gate electrode layers of the first gate structure 310 might not necessarily be limited to four. The gate electrode layers may be arranged in various numbers, and the interlayer insulation layer may insulate the various numbers of the gate electrode layers from each other along the first direction (i.e., the z-direction).

Referring to FIGS. 9 to 12, the gate insulation layers 320a, 320b, and 320c may be disposed, on the channel lower contact layer 105, to cover a sidewall surface S1 of the first gate structure 310. The gate insulation layers 320a, 320b, and 320c may be isolated from each other with respect to the second direction (i.e., the y-direction) by first and second cell insulation structures 380a and 380b. That is, the gate insulation layers 320a, 320b, and 320c may be disposed spaced apart from each other with respect to the second direction (i.e., the y-direction). Each of the gate insulation layers 320a, 320b, and 320c may include an insulating material. The insulating material of the gate insulation layers 320a, 320b, and 320c may be substantially the same as the insulating material of the gate insulating layer 120 of the nonvolatile memory device 1 described above with reference to FIGS. 1 to 3.

The first ion retention layers 330a, 330b, and 330c, the second ion retention layers 340a, 340b, and 340c, and the channel layers 350a, 350b, and 350c may be disposed, on the channel lower contact layer 105, to sequentially cover the gate insulation layers 320a, 320b, and 320c, respectively. The first ion retention layers 330a, 330b, and 330c, the second ion retention layers 340a, 340b, and 340c, and the channel layers 350a, 350b, and 350c may be isolated from each other with respect to the second direction (i.e., the y-direction) by the first and second cell insulation structures 380a and 380b.

The second ion retention layers 340a, 340b, and 340c may include ions exchangeable with corresponding first ion retention layers 330a, 330b, and 330c. Materials constituting the first ion retention layers 330a, 330b, and 330c and the second ion retention layers 340a, 340b, and 340c may be substantially the same as the materials constituting the first ion retention layer 130 and the second ion retention layer 140 of the nonvolatile memory device 1 described above with reference to FIGS. 1 to 3.

Each of the channel layers 350a, 350b, and 350c may include a semiconductor material. The semiconductor material of the channel layers 350a, 350b, and 350c may be substantially the same as the semiconductor material of the channel layer 150 of the nonvolatile memory device 1 described above with reference to FIGS. 1 to 3.

Meanwhile, the second gate structure 410 may be disposed, on the channel lower contact layer 105, to be spaced apart from the first gate structure 310 in a third direction (i.e., the x-direction). The second gate structure 410 may include first to fourth gate electrode layers 412a, 412b, 412c, and 412d and first to fifth interlayer insulation layers 413a, 413b, 413c, 413d, and 413e, which are alternately stacked along the first direction (i.e., the z-direction). The configurations of the first to fourth gate electrode layers 412a, 412b, 412c, and 412d and first to fifth interlayer insulation layers 413a, 413b, 413c, 413d, and 413e may be substantially the same as the configurations of the first to fourth gate electrode layers 312a, 312b, 312c, and 312d and first to fifth interlayer insulation layers 313a, 313b, 313c, 313d, and 313e of the first gate structure 310.

Referring to FIGS. 9 to 12, the gate insulation layers 420a, 420b, and 420c may be disposed, on the channel lower contact layer 105, to cover a sidewall surface S2 of the second gate structure 410. The gate insulation layers 420a, 420b, and 420c may be isolated from each other with respect to the second direction (i.e., the y-direction) by first and second cell insulation structures 380a and 380b. That is, the gate insulation layers 420a, 420b, and 420c may be disposed to be spaced apart from each other with respect to the second direction (i.e., the y-direction). Each of the gate insulation layers 420a, 420b, and 420c may include an insulating material. The insulating material of the gate insulation layers 420a, 420b, and 420c may be substantially the same as the insulating material of the gate insulation layer 120 of the nonvolatile memory device 1 described above with reference to FIGS. 1 to 3.

The first ion retention layers 430a, 430b, and 430c, the second ion retention layers 440a, 440b, and 440c, and the channel layers 450a, 450b, and 450c may be disposed, on the channel lower contact layer 105, to sequentially cover the respective gate insulation layers 420a, 420b, and 420c. The first ion retention layers 430a, 430b, and 430c, the second ion retention layers 440a, 440b, and 440c, and the channel layers 450a, 450b, and 450c may be isolated from each other with respect to the second direction (i.e., the y-direction) by the first and second cell insulation structures 380a and 380b.

The second ion retention layers 440a, 440b, and 440c may include ions exchangeable with the corresponding first ion retention layers 430a, 430b, and 430c. Materials constituting the first ion retention layers 430a, 430b, and 430c and the second ion retention layers 440a, 440b, and 440c may be substantially the same as the materials constituting the first ion retention layer 130 and the second ion retention layer 140 of the nonvolatile memory device 1 described above with reference to FIGS. 1 to 3.

Each of the channel layers 450a, 450b, and 450c may include a semiconductor material. The semiconductor material of the channel layers 450a, 450b, and 450c may be substantially the same as the semiconductor material of the channel layer 150 of the nonvolatile memory device 1 described above with reference to FIGS. 1 to 3.

Filling structures 360a, 360b, and 360c may be respectively disposed, on the channel lower contact layer 105, between the channel layers 350a, 350b, and 350c of the first gate structure 310 and the channel layers 450a, 450b, and 450c of the second gate structure 410. The filling structures 360a, 360b, and 360c may be separated from each other by the cell insulation structures 380a and 380b. Each of the filling structures 360a, 360b, and 360c may include an insulating material. The insulating material may include, for example, oxide, nitride, oxynitride, or a combination of two or more thereof.

The channel upper contact layers 370a, 370b, and 370c may be disposed on the filling structures 360a, 360b, and 360c. The channel upper contact layers 370a, 370b, and 370c may be separated from each other by the cell insulation structures 380a and 380b. The channel upper contact layers 370a, 370b, and 370c may be respectively disposed to contact the corresponding channel layers 350a, 350b, and 350c of the first gate structure 310 and the channel layers 450a, 450b, and 450c of the second gate structure 410.

The cell insulation structures 380a and 380b may be disposed, on the channel lower contact layer 105, to extend in the first direction (i.e., the z-direction). The cell insulation structures 380a and 380b may be disposed to contact the first and second gate structures 310 and 410 in a third direction (i.e., the x-direction). The cell insulation structures 380a and 380b may be disposed to be spaced apart from each other in the second direction (i.e., the y-direction). Each of the cell insulation structures 380a and 380b may include an insulating material. The insulating material may include, for example, oxide, nitride, oxynitride, or a combination of two or more thereof.

Referring to FIGS. 9 and 10 again, the nonvolatile memory device 3 may include first to sixth memory element units U31, U32, U33, U34, U35, and U36, which perform operations independently of each other. The first memory element unit U31 may include the first gate structure 310, the first gate insulation layer 320a, the first ion retention layer 330a, the second ion retention layer 340a, the channel layer 350a, and the channel upper contact layer 370a. In the same way, as illustrated in FIG. 9, each of the second to sixth memory element units U32, U33, U34, U35, and U36 may include a gate structure and a corresponding first gate insulation layer, first ion retention layer, second ion retention layer, channel layer, and channel upper contact layer. The first to sixth memory element units U31, U32, U33, U34, U35, and U36 may share the channel lower contact layer 105.

The circuit diagram of any one of the first to sixth memory element units U31, U32, U33, U34, U35, and U36 may be substantially the same as the circuit diagram of FIG. 4. Operation methods of the first to sixth memory element units U31, U32, U33, U34, U35, and U36 may be substantially the same as the operation method of the nonvolatile memory device 1 described above in connection with FIGS. 5A to 5F. That is, the write operation and the read operation of any one of the first to sixth memory element units U31, U32, U33, U34, U35, and U36 may be substantially the same as the write operation and the read operation of the nonvolatile memory device 1 described above in connection with FIGS. 5A to 5F.

Figure 13:
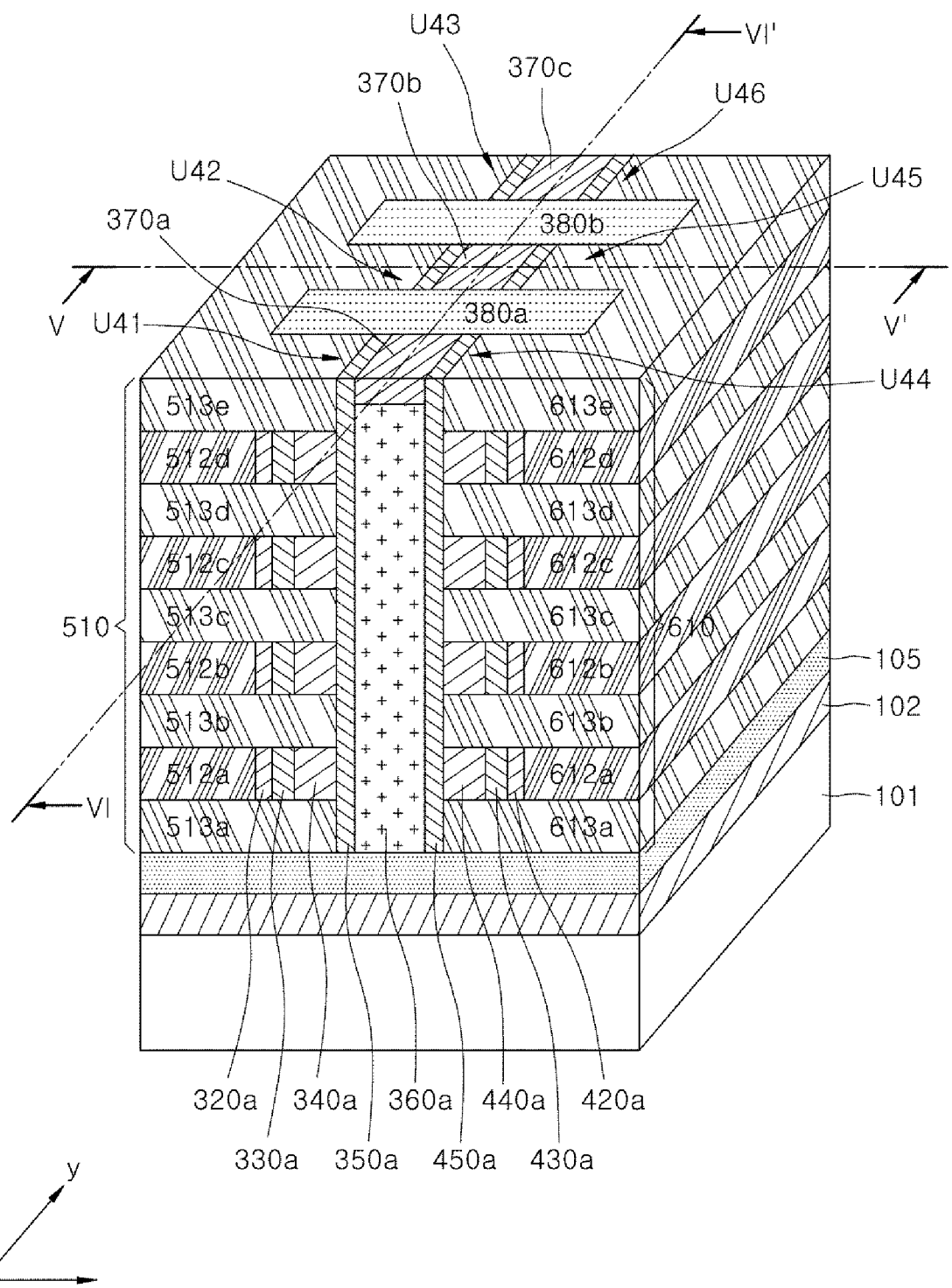
FIG. 13 is a perspective view schematically illustrating a nonvolatile memory device according to still yet another embodiment of the present disclosure.
Figure 14:
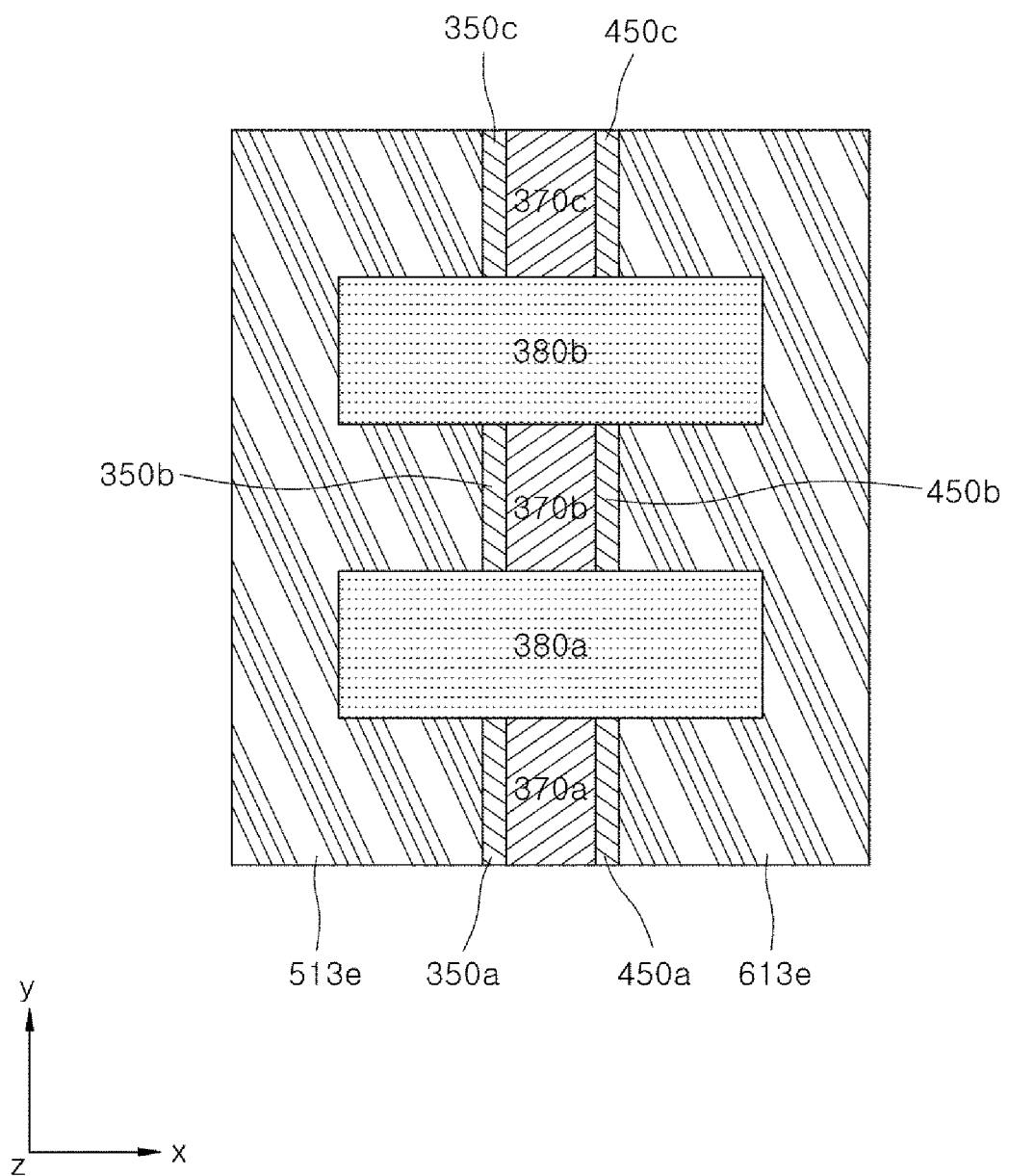
FIG. 14 is a plan view of the nonvolatile memory device of FIG. 13.
Figure 15:
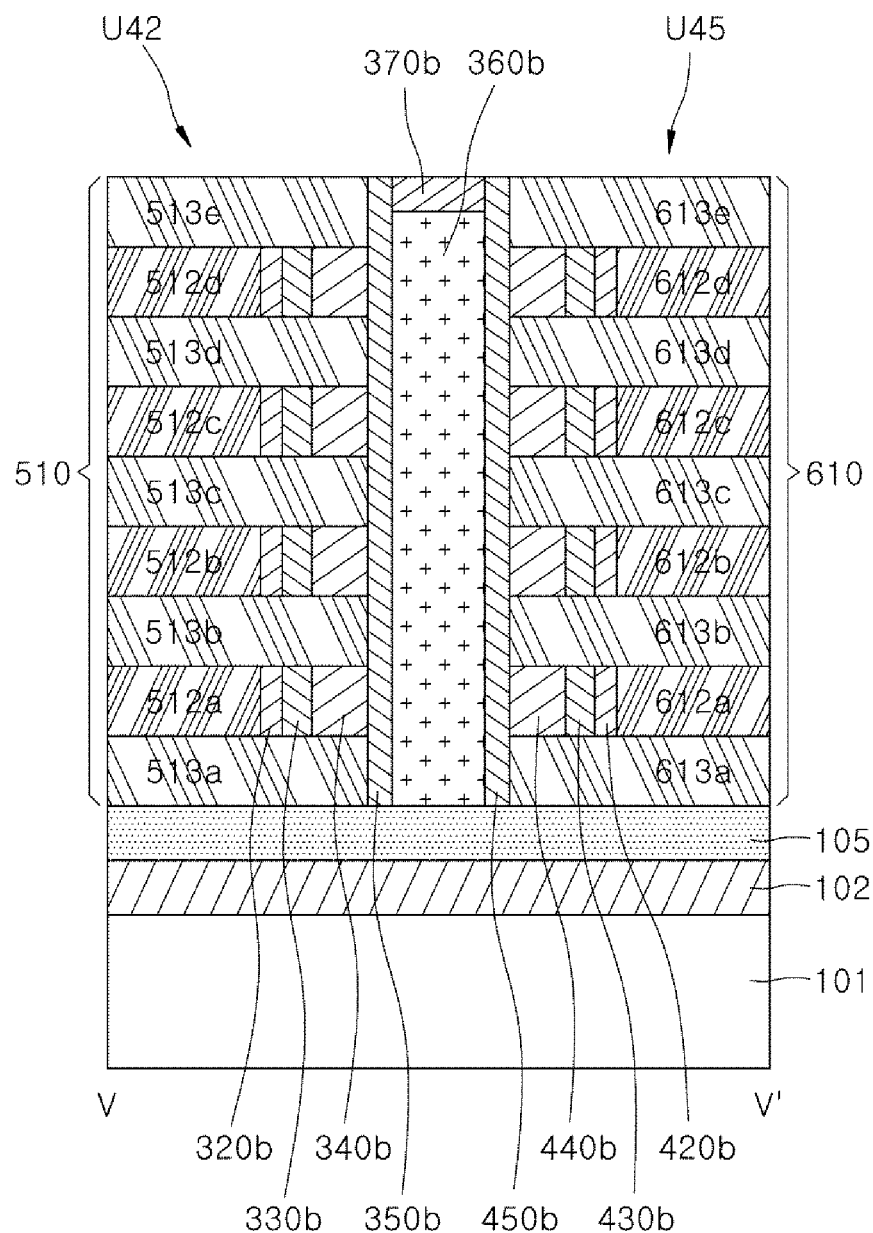
FIG. 15 is a cross-sectional view taken along a line V-V' of the nonvolatile memory device of FIG. 13.
Figure 16:
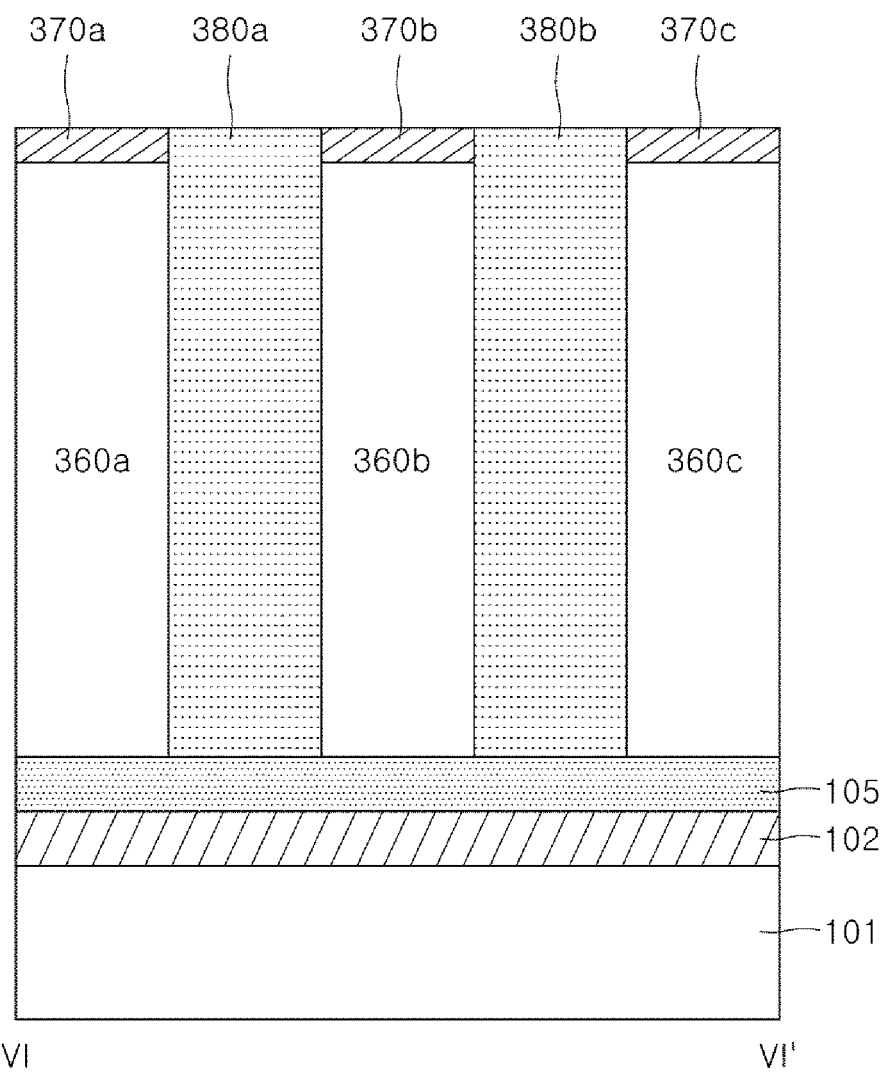
FIG. 16 is a cross-sectional view taken along a line VI-VI' of the nonvolatile memory device of FIG. 13.

FIG. 13 is a perspective view schematically illustrating a nonvolatile memory device 4 according to still yet another embodiment of the present disclosure. FIG. 14 is a plan view of the nonvolatile memory device 4 of FIG. 13. FIG. 15 is a cross-sectional view taken along a line V-V' of the nonvolatile memory device 4 of FIG. 13. FIG. 16 is a cross-sectional view taken along a line VI-VI' of the nonvolatile memory device 4 of FIG. 13.

Referring to FIGS. 13 to 16, the nonvolatile memory device 4 may be different from the nonvolatile memory device 3 described above with reference to FIGS. 9 to 12 in configurations of first and second gate structures 510 and 610. The rest of the configuration of the nonvolatile memory device 4, except for the first and second gate structures 510 and 610, may be substantially the same as that of the nonvolatile memory device 3.

The first gate structure 510 may include first to fourth gate electrode layers 512a, 512b, 512c, and 512d and first to fifth interlayer insulation layers 513a, 513b, 513c, 513d, and 513e, which are alternately stacked along a first direction (i.e., the z-direction) on a channel lower contact layer 105. The first interlayer insulation layer 513a may be disposed to contact the channel lower contact layer 105. The fifth interlayer insulation layer 513e may be disposed as the uppermost layer of the first gate structure 510. Similarly, the second gate structure 610 may include first to fourth gate electrode layers 612a, 612b, 612c, and 612d and first to fifth interlayer insulation layers 613a, 613b, 613c, 613d, and 613e, which are alternately stacked along a first direction (i.e., the z-direction) on a channel lower contact layer 105. The first interlayer insulation layer 613a may be disposed to contact the channel lower contact layer 105. The fifth interlayer insulation layer 613e may be disposed as the uppermost layer of the second gate structure 610.

Referring to FIGS. 13 to 16, the first to fifth interlayer insulation layers 513a, 513b, 513c, 513d, and 513e of the first gate structure 510 may further extend toward a third direction (i.e., the x-direction) compared to the first to fifth interlayer insulating layers 313a, 313b, 313c, 313d, and 313e of the first gate structure 310 described above with reference to FIGS. 9 to 12. Specifically, the first to fifth interlayer insulation layers 513a, 513b, 513c, 513d, and 513e of the first gate structure 510 may be disposed to contact the channel layers 350a, 350b, and 350c. Similarly, in the present embodiment, the first to fifth interlayer insulation layers 613a, 613b, 613c, 613d, and 613e of the second gate structure 610 may further extend toward the third direction (i.e., the x-direction) compared to the first to fifth interlayer insulating layers 413a, 413b, 413c, 413d, and 413e of the second gate structure 410 described above with reference to FIGS. 9 to 12. Specifically, the first to fifth interlayer insulation layers 613a, 613b, 613c, 613d, and 613e of the second gate structure 610 may be disposed to contact the channel layers 450a, 450b, and 450c.

The first to fifth interlayer insulation layers 513a, 513b, 513c, 513d, and 513e of the first gate structure 510 may separate the gate insulation layers 320a, 320b, and 320c, the first ion retention layers 330a, 330b, and 330c, and the second ion retention layers 340a, 340b, and 340c in the z-direction. For example, as compared with the nonvolatile memory device 3 described above with reference to FIGS. 9 to 12, the gate insulation layer, the first ion retention layer, and the second ion retention layer are divided into segments or portions that are spaced apart in the z-direction. As a result, the regions of the gate insulation layers 320a, 320b, and 320c, the regions of the first ion retention layers 330a, 330b, and 330c, and the regions of the second ion retention layers 340a, 340b, and 340c that are electrically controlled by the first to fourth gate electrode layers 512a, 512b, 512c, and 512d, respectively, can be separated from each other in the z-direction by the interlayer insulating layers 513a, 513b, 513c, 513d, and 513e. In other words, it is possible to prevent the regions of the gate insulation layers 320a, 320b, and 320c, the regions of the first ion retention layers 330a, 330b, and 330c, and the regions of the second ion retention layers 340a, 340b, and 340c from interference or control by the neighboring gate electrode layers among the first to fourth gate electrode layers 512a, 512b, 512c, and 512d, thereby preventing redundant or double control. Accordingly, electrical interference occurring between neighboring memory cells along the z-direction can be effectively reduced or prevented by extending first to fifth interlayer insulation layers 513a, 513b, 513c, 513d, and 513e.

Likewise, the first to fifth interlayer insulation layers 613a, 613b, 613c, 613d, and 613e of the second gate structure 610 extend to contact in the x-direction to contact channel layers 450a, 450b, and 450c. Gate insulation layers 420a, 420b, and 420c, the first ion retention layers 430a, 430b, and 430c, and the second ion retention layers 440a, 440b, and 440c may be separated or partitioned in the z-direction. As a result, the regions of the gate insulation layers 420a, 420b, and 420c, the regions of the first ion retention layers 430a, 430b, and 430c, and the regions of the second ion retention layers 440a, 440b, and 440c that are electrically controlled by the first to fourth gate electrode layers 612a, 612b, 612c, and 612d, respectively, can be separated from each other in the z-direction by the interlayer insulating layers 613a, 613b, 613c, 613d, and 613e. In other words, it is possible to prevent the regions of the gate insulation layers 420a, 420b, and 420c, the regions of the first ion retention layers 430a, 430b, and 430c, and the regions of the second ion retention layers 440a, 440b, and 440c from interference or control by the adjacent gate electrode layers among the first to fourth gate electrode layers 612a, 612b, 612c, and 612d, thereby preventing redundant or double control. Accordingly, electrical interference occurring between neighboring memory cells along the z-direction can be effectively reduced or prevented by extending first to fifth interlayer insulation layers 613a, 613b, 613c, 613d, and 613e.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A nonvolatile memory device comprising:
   a substrate;
   a gate structure disposed on the substrate, the gate structure including at least one gate electrode layer and at least one interlayer insulation layer that are alternately stacked;
   a hole pattern penetrating the gate structure on the substrate; and
   a gate insulation layer, a first ion retention layer, a second ion retention layer, and a channel layer sequentially covering a sidewall surface of the gate electrode layer in the hole pattern,
   wherein the first and second ion retention layers comprise ions exchangeable with each other.

2. The nonvolatile memory device of claim 1, further comprising:
   a channel lower contact layer disposed on the substrate, contacting a first end of the channel layer; and
   a channel upper contact layer contacting a second, opposite end of the channel layer,
   wherein the channel lower contact layer and the channel upper contact layer are electrically connected to a source electrode and a drain electrode, respectively.

3. The nonvolatile memory device of claim 1, wherein the first and second ion retention layers comprise metal cations exchangeable with each other.

4. The nonvolatile memory device of claim 3, wherein the first ion retention layer provides metal cations to the second ion retention layer when a predetermined positive voltage is applied to the gate electrode layer.

5. The nonvolatile memory device of claim 4, wherein, after the positive voltage applied to the gate electrode layer is removed, the second ion retention layer stores, in a non-volatile manner, an electrical resistance that is decreased based on an increased amount of the metal cations.

6. The nonvolatile memory device of claim 3, wherein the second ion retention layer provides metal cations to the first ion retention layer when a predetermined negative voltage is applied to the gate electrode layer.

7. The nonvolatile memory device of claim 6, wherein, after the negative voltage applied to the gate electrode layer is removed, the second ion retention layer stores, in a non-volatile manner, an electrical resistance that is increased based on a decreased amount of the metal cations.

8. The nonvolatile memory device of claim 1, wherein each of the first and second ion retention layers comprises at least one selected from lithium-based oxide, transition metal oxide, and perovskite-based materials.

9. The nonvolatile memory device of claim 1, wherein the second ion retention layer has a multi-level electrical resistance based on an amount of retained ions.

10. The nonvolatile memory device of claim 1, wherein the interlayer insulation layer extends toward a center of the hole pattern to be disposed to contact the channel layer.

11. The nonvolatile memory device of claim 1 wherein the second ion retention layer is disposed to contact the channel layer.

12. A nonvolatile memory device comprising:
   a substrate;
   a gate structure disposed on the substrate, the gate structure including at least one gate electrode layer and at least one interlayer insulation layer that are alternately stacked along a first direction perpendicular to an upper surface of the substrate, wherein the gate structure extends in a second direction perpendicular to the first direction; and
   a gate insulation layer, a first ion retention layer, a second ion retention layer, and a channel layer sequentially covering a sidewall surface of the gate electrode layer on the substrate,
   wherein the first and second ion retention layers comprise ions exchangeable with each other.

13. The nonvolatile memory device of claim 12, wherein the first and second ion retention layers comprise metal cations exchangeable with each other.

14. The nonvolatile memory device of claim 12, wherein each of the first and second ion retention layers comprises at least one selected from lithium-based oxide, transition metal oxide, and perovskite-based materials.

15. The nonvolatile memory device of claim 12, further comprising:
   a channel lower contact layer disposed on the substrate, contacting a first end of the channel layer; and
   a channel upper contact layer contacting a second, opposite end of the channel layer,
   wherein the channel lower contact layer and the channel upper contact layer are electrically connected to a source electrode and a drain electrode, respectively.

16. The nonvolatile memory device of claim 12, wherein the second ion retention layer has a multi-level electrical resistance based on an amount of retained ions.

17. The nonvolatile memory device of claim 16, wherein the amount of retained ions is controlled by a voltage applied to the gate electrode layer.

18. The nonvolatile memory device of claim 12, further comprising a plurality of cell insulation structures disposed on the substrate and spaced apart from each other in the second direction,
   wherein the plurality of cell insulation structures extend in the first direction on the substrate and extend in a third direction perpendicular to the first and second directions and separate the first ion retention layer, the second ion retention layer and the channel layer with respect to the second direction.

19. The nonvolatile memory device of claim 12, wherein the interlayer insulation layer extends in a third direction perpendicular to the first and second directions to be disposed to contact the channel layer.

20. The nonvolatile memory device of claim 12, wherein the second ion retention layer is disposed to contact the channel layer.

* * * * *